(12) United States Patent
Li et al.

(10) Patent No.: US 12,300,306 B2
(45) Date of Patent: May 13, 2025

(54) MEMORY, DRIVE METHOD, MEMORY SYSTEM, AND ELECTRONIC DEVICE

(71) Applicant: YANGTZE MEMORY TECHNOLOGIES CO., LTD., Wuhan (CN)

(72) Inventors: Danyang Li, Wuhan (CN); Daesik Song, Wuhan (CN); Yu Wang, Wuhan (CN); Zhichao Du, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 215 days.

(21) Appl. No.: 18/092,121

(22) Filed: Dec. 30, 2022

(65) Prior Publication Data
US 2024/0212740 A1 Jun. 27, 2024

(30) Foreign Application Priority Data

Dec. 22, 2022 (CN) .......................... 202211657900.4

(51) Int. Cl.
G11C 8/08 (2006.01)
G11C 8/10 (2006.01)
G11C 11/408 (2006.01)
G11C 16/08 (2006.01)

(52) U.S. Cl.
CPC ............ G11C 11/4085 (2013.01); G11C 8/08 (2013.01); G11C 8/10 (2013.01); G11C 11/4087 (2013.01); G11C 16/08 (2013.01)

(58) Field of Classification Search
CPC ... G11C 11/4085; G11C 11/4087; G11C 8/08; G11C 5/063; G11C 8/10; G11C 8/18; G11C 16/08; G11C 16/10
See application file for complete search history.

(56) References Cited

U.S. PATENT DOCUMENTS

| | | | | |
|---|---|---|---|---|
| 5,121,358 A | * | 6/1992 | Slemmer .................. | G11C 8/18 365/230.03 |
| 7,345,946 B1 | * | 3/2008 | Chapman ............. | G11C 11/4085 365/189.11 |
| 7,646,653 B2 | * | 1/2010 | Choi .................... | G11C 11/4074 365/230.06 |
| 2007/0030741 A1 | * | 2/2007 | Nii .......................... | G11C 5/14 365/189.11 |
| 2007/0140037 A1 | * | 6/2007 | Khamesra .............. | G11C 5/148 365/230.06 |
| 2009/0245011 A1 | * | 10/2009 | Chen .................. | G11C 11/4085 365/230.06 |

(Continued)

Primary Examiner — Huan Hoang
Assistant Examiner — Justin Bryce Heisterkamp
(74) Attorney, Agent, or Firm — BAYES PLLC

(57) ABSTRACT

A memory includes a peripheral circuit and a memory array. The memory array includes word lines. The peripheral circuit includes a driver, a repeater, and a discharge circuit. An output terminal of the driver is coupled with a controlled terminal of the repeater. An output terminal of the repeater is coupled with a controlled terminal of the discharge circuit. The discharge circuit is coupled with a word line in the memory array. The driver is configured to output a first control signal to the repeater. The repeater is configured to output a second control signal to the discharge circuit according to the first control signal.

20 Claims, 17 Drawing Sheets

(56) References Cited

U.S. PATENT DOCUMENTS

| | | | | |
|---|---|---|---|---|
| 2009/0279348 A1* | 11/2009 | Hirabayashi | ........... | H10B 10/00 |
| | | | | 365/230.06 |
| 2012/0026778 A1* | 2/2012 | Maejima | ............ | G11C 13/0004 |
| | | | | 365/148 |
| 2013/0314969 A1* | 11/2013 | Kouno | ................ | G11C 13/0023 |
| | | | | 365/65 |
| 2014/0241089 A1* | 8/2014 | Holla | .................... | G11C 11/419 |
| | | | | 365/206 |
| 2018/0122442 A1* | 5/2018 | Son | ........................ | G11C 7/065 |
| 2018/0197585 A1* | 7/2018 | Louche | ................. | G11C 11/418 |
| 2020/0327916 A1* | 10/2020 | Suzuki | ..................... | G11C 8/14 |
| 2022/0399052 A1* | 12/2022 | Chu | ..................... | G11C 11/4076 |
| 2023/0059803 A1* | 2/2023 | He | ........................... | G11C 8/08 |
| 2023/0170011 A1* | 6/2023 | Shang | ................. | G11C 11/4087 |
| | | | | 365/230.06 |
| 2023/0186960 A1* | 6/2023 | Kim | ................. | H03K 19/01742 |
| | | | | 365/233.1 |
| 2023/0260570 A1* | 8/2023 | Lin | ......................... | G11C 8/08 |
| | | | | 365/154 |
| 2023/0317139 A1* | 10/2023 | Sato | ......................... | G11C 8/14 |
| | | | | 365/230.06 |

* cited by examiner

MEMORY, DRIVE METHOD, MEMORY SYSTEM, AND ELECTRONIC DEVICE

CROSS-REFERENCE TO RELATED APPLICATIONS

This application claims the benefit of priority to Chinese Application No. 202211657900.4, filed on Dec. 22, 2022, which is incorporated herein by reference in its entirety.

TECHNICAL FIELD

The present disclosure relates to the technical field of semiconductor chip memory, in particular to a memory, a drive method, a memory system, and an electronic device.

BACKGROUND

A memory is provided therein with a peripheral circuit and a memory array. The memory array comprises a plurality of word lines (WL), each word line being coupled with memory cells. By performing a programming operation on the memory cells in the memory array, operations of reading data, writing data, refreshing data, etc., may be achieved.

An application mode of the memory is as follows: the word lines are precharged by a peripheral circuit before a programming operation is performed. After the programming operation is completed, the word lines are discharged. However, the discharge operation has the problem of excessively slow discharge speed.

SUMMARY

The present disclosure provides a memory, a drive method, a memory system, and an electronic device, which aim to address the problem of excessively slow discharge speed of word lines in a memory array of the memory. In order to achieve the above purpose, the present disclosure adopts the following technical solutions.

In a first aspect, a memory is provided. The memory comprises a memory array and a peripheral circuit. The memory array comprises memory array blocks, and each memory array block comprises a plurality of word lines, a plurality of bit lines (BL), and a plurality of memory cells. The peripheral circuit comprises a row address decoding circuit, a plurality of discharge circuits, a plurality of charge circuits, a driver, a repeater, a column address decoding circuit, and a sense amplifier. The row address decoding circuit is coupled with the charge circuits and the driver respectively, the driver is coupled with the repeater, and the repeater is coupled with the discharge circuits; and each discharge circuit and each charge circuit are coupled with corresponding word lines in the memory array blocks, respectively. The column address decoding circuit and the sense amplifier are coupled with the bit lines, respectively.

In the above embodiments of the present disclosure, the repeater receives a first control signal output by the driver and outputs a second control signal to a discharge circuit under the control of the first control signal, and the discharge circuit discharges a word line under the control of the second control signal. In an embodiment of the present disclosure, the driver no longer directly drives the discharge circuit, but the first control signal is used to trigger the repeater, and then the triggered repeater drives the discharge circuit. In this implementation, the requirement for the drive capability of the driver is reduced. Meanwhile, after the driver outputs the first control signal to the repeater, the first control signal reaches the repeater through a certain length of a routing metal line. At this time, the second control signal output by the repeater can reach the discharge circuit only through a remaining length of the routing metal line and drive the discharge circuit. Because the routing metal line has a certain load, the longer the length of the routing metal line, the greater the loss of the transmitted control signal. Compared with the mode in which the driver outputs the first control signal to the discharge circuit and drives the discharge circuit through the first control signal, in the mode in which the repeater outputs the second control signal to drive the discharge circuit, because the repeater is closer to the discharge circuit and the distance of transmitting the second control signal through the routing metal line is shorter, the loss of the second control signal caused by the routing metal line is lower, thereby improving the speed at which the discharge circuit is driven to perform a discharge operation normally. In addition, since the repeater is added, in the actual chip routing layout design, a routing metal line through which the first control signal passes may be designed according to the positions of the driver and the repeater, and a routing metal line through which the second control signal passes may be designed according to the positions of the repeater and the discharge circuit.

Therefore, compared with the application mode in which the driver directly outputs the first control signal to the discharge circuit, in the solution of designing the routing metal line through which the first control signal passes according to a larger distance between the driver and the discharge circuit, the routing metal line in the embodiment of the present disclosure may be designed to be simpler, and the routing metal line through which the second control signal passes may be designed to be shorter, thereby further improving the discharge speed of the discharge circuit.

In some embodiments, the repeater comprises a first transistor and a first voltage terminal; a gate of the first transistor is coupled with a controlled terminal of the repeater; a first electrode of the first transistor is coupled with the first voltage terminal; the first voltage terminal is used to input a second control signal; and a second electrode of the first transistor is coupled with an output terminal of the repeater.

In the above embodiments of the present disclosure, the driver outputs a first control signal to the controlled terminal of the repeater, and the first control signal enables the first transistor to be turned on. The first electrode of the first transistor is coupled to the first voltage terminal to input the second control signal, and the turned-on first transistor outputs the second control signal input at the first electrode to the output terminal of the repeater through the second electrode of the second transistor, and outputs the second control signal from the output terminal of the repeater to the controlled terminal of the discharge circuit to control the discharge circuit to discharge the word line through the discharge terminal.

In some embodiments, the repeater further comprises a repeater select transistor. A first electrode of the repeater select transistor is coupled with the first voltage terminal; a second electrode of the repeater select transistor is coupled with the first electrode of the first transistor; and the first electrode of the first transistor is used to couple with the first voltage terminal through the repeater select transistor.

In the above embodiments of the present disclosure, a repeater select signal may have different levels, for example, when the repeater select signal is at a high level, the repeater select transistor is controlled to be turned on by the repeater select signal, so that all the first transistors in corresponding repeaters output second control signals to the discharge circuits; alternatively, for example, when the repeater select signal is at a low level, the repeater select transistor is controlled to be turned off by the repeater select signal, so that all the first transistors in the corresponding repeaters stop outputting second control signals to the discharge circuits and output third control signals to the discharge circuits. Since the repeater corresponds to a respective memory array block, the memory array block may be selected by controlling the repeater.

In some embodiments, the repeater further comprises a second transistor and a second voltage terminal. A gate of the second transistor is coupled with the controlled terminal of the repeater; a first electrode of the second transistor is coupled with the second voltage terminal; the second voltage terminal is used to input a third control signal; and a second electrode of the second transistor is coupled with the output terminal of the repeater.

In the above embodiments of the present disclosure, the third control signal may be output by the second transistor, and the discharge circuit may be controlled not to discharge the word line by the third control signal.

In some embodiments, the driver comprises a controlled terminal and a plurality of cascaded inverters. A controlled terminal of the driver is used to input a drive control signal; a controlled terminal of a first-stage inverter of the plurality of cascaded inverters is coupled with the controlled terminal of the driver; and an output terminal of a last-stage inverter of the plurality of cascaded inverters is coupled with an output terminal of the driver.

In the above embodiments of the present disclosure, the input drive control signal is inverted several times by a plurality of inverters to obtain a first control signal and output the same to a corresponding repeater. In this process, the specific number of the plurality of inverters may be adaptively adjusted according to the levels of the drive control signal and the first control signal in practical applications.

In some embodiments, the driver further comprises a third voltage terminal and a fourth voltage terminal. The third voltage terminal is used to input a first voltage signal, and the fourth voltage terminal is used to input a second voltage signal. Any of the plurality of inverters comprises a first inverter circuit; the first inverter circuit comprises a third transistor and a fourth transistor; a first electrode of the third transistor is coupled with the third voltage terminal; a first electrode of the fourth transistor is coupled with the fourth voltage terminal; a gate of the third transistor and a gate of the fourth transistor are coupled and then used together as a controlled terminal of the first inverter circuit; and a second electrode of the third transistor and a second electrode of the fourth transistor are coupled and then used together as an output terminal of the first inverter circuit.

In the above embodiments of the present disclosure, one first inverter circuit is formed by the third transistor and the fourth transistor. One of the third transistor and the fourth transistor is a P-Metal-Oxide-Semiconductor (PMOS), and the other is an N-Metal-Oxide-Semiconductor (NMOS). The gates of the two transistors are used together as a controlled terminal of the first inverter circuit, and the second electrodes of the two transistors are used together as an output terminal of the first inverter circuit. Taking the third transistor as the PMOS transistor and the fourth transistor as the NMOS transistor as an example, the first electrode of the third transistor is used to input a first voltage signal (e.g., at a high level). The first electrode of the fourth transistor (NMOS transistor) is used to input a second voltage signal (e.g., at a low level). In this way, when the low level is input to a controlled terminal of one inverter, the third transistor is turned on, and the fourth transistor is turned off, and an output terminal of the inverter outputs the first voltage signal to a next-stage inverter through the second electrode of the third transistor, thus realizing the inversion from the input signal to the output signal. Similarly, after the first voltage signal is input to a controlled terminal of the next stage inverter, in the case where the high level is input to the gate, a third transistor of the next-stage inverter is turned off, and a fourth transistor is turned on, so that the next-stage inverter outputs the second voltage signal through the second electrode of the fourth transistor, so as to realize the inversion from the input of the first voltage signal to the output of the second voltage signal.

In some embodiments, any of the inverters further comprises a second inverter circuit. The second inverter circuit comprises a fifth transistor and a sixth transistor. A first electrode of the fifth transistor is coupled with the third voltage terminal; a first electrode of the sixth transistor is coupled with the fourth voltage terminal; a gate of the fifth transistor and a gate of the sixth transistor are coupled and then used together as a controlled terminal of the second inverter circuit; a second electrode of the fifth transistor and a second electrode of the sixth transistor are coupled and then used together as an output terminal of the second inverter circuit; the output terminal of the second inverter circuit is coupled with a controlled terminal of a first inverter circuit in a corresponding inverter; and the controlled terminal of the second inverter circuit is coupled with an output terminal of the first inverter circuit in the corresponding inverter.

In the above embodiments of the present disclosure, by disposing the second inverter circuit, the output of the first inverter circuit may be made more stable, so that the output of the driver may also be made more stable.

In some embodiments, the memory comprises a row address decoding circuit. The row address decoding circuit is coupled with a gating terminal of the driver; the row address decoding circuit is used to output an address select signal to the gating terminal of the driver; and the address select signal is used to control the driver to stop outputting the first control signal to the repeater.

In the above embodiments of the present disclosure, a plurality of drivers may be disposed, and may be coupled with the word lines with different row addresses, respectively. The address select signal is output by the row address decoding circuit, and a corresponding driver is controlled by the address select signal to stop outputting the first control signal to the repeater. In this way, after a certain repeater stops outputting the first control signal, the discharge circuit coupled with the repeater cannot discharge a word line coupled therewith.

In some embodiments, the driver further comprises an address select switching transistor. A gate of the address select switching transistor is coupled with the row address decoding circuit through the gating terminal of the driver; a first electrode of the address select switching transistor is coupled to any of the plurality of inverters; and the address select signal is used to control the address select switching transistor to be turned on or turned off.

In the above embodiments of the present disclosure, the first control signal can only be generated when a plurality of cascaded inverters act together, and the first control signal cannot be generated when any of the inverters cannot operate under a corresponding control logic. Based on this, the address select switching transistor is coupled to any of the plurality of inverters, then an address select signal is output by the row address decoding circuit to the address select switching transistor, to control whether to turn on a corresponding address select switching transistor by the address select signal.

In some implementations, for the plurality of cascaded inverters, the transistor size of the last-stage inverter is larger than that of the previous-stage inverter.

In the above embodiments of the present disclosure, the last-stage inverter in the driver needs to be used to control the repeater, so the size of the transistor in the inverter may be adaptively set to be larger to improve the drive capability of the first control signal.

In some embodiments, the discharge circuit comprises a seventh transistor. A first electrode of the seventh transistor is coupled with the word line; a second electrode of the seventh transistor is a discharge voltage terminal; the discharge voltage terminal is used to connect a discharge voltage; and a gate of the seventh transistor is used to input a second control signal.

In the above embodiments of the present disclosure, the seventh transistor functions as a switching transistor. When the switching transistor is turned on, the word line is connected with the discharge voltage terminal, and a voltage of the corresponding word line is lowered by the discharge voltage of the discharge voltage terminal. When different types of transistors are selected as seventh transistors, accordingly, the level of the second control signal used to turn on the seventh transistor is also different. Furthermore, according to the different levels of the second control signal actually used to turn on the seventh transistor, a drive control signal, a first control signal, etc. at corresponding levels may be adaptively set in the aspect of the driver.

In some embodiments, an output terminal of a charge circuit is coupled with a word line; the charge circuit is used to input a charge control signal; and the charge control signal is used to control the charge circuit to output a charge voltage to the word line.

In the above embodiments of the present disclosure, the discharge circuit can also be controlled to discharge the word line by the charge control signal.

In some embodiments, the charge circuit comprises an eighth transistor and a ninth transistor. A first electrode of the eighth transistor is used to input a first voltage signal; a first electrode of the ninth transistor is used to input a second voltage signal; a gate of the eighth transistor and a gate of the ninth transistor are coupled and then used together as a controlled terminal of a charge circuit; a second electrode of the eighth transistor and a second electrode of the ninth transistor are coupled and then used together as an output terminal of the charge circuit, and the output terminal of the charge circuit is coupled with a corresponding word line. A voltage value of the first voltage signal is greater than that of the second voltage signal.

In the above embodiments of the present disclosure, a first voltage signal with a certain positive voltage value is output to the corresponding word line through the turned-on eighth transistor, so that the voltage of the word line can be raised to complete the charging of the word line.

In some embodiments, the memory cell may be a memory cell comprising a field effect transistor and a capacitor, a memory cell comprising a semi-floating gate transistor or a memory cell comprising a floating gate transistor, or the like.

In some embodiments, the peripheral circuit further comprises a column address decoding circuit and a plurality of sense amplifiers (SA), and input terminals of the column address decoding circuit and each sense amplifier are coupled with a corresponding bit line.

In the above embodiments of the present disclosure, the column address decoding circuit is used to select a corresponding bit line to perform a programming operation on all or some of the memory cells coupled to the selected bit line and also coupled to the selected word line. The sense amplifier is used to compare the voltage value output by the memory cell corresponding to the selected word line on the coupled bit line, and output a sense signal used to indicate a comparison result.

In a second aspect, a drive method for a memory is provided. The memory comprises a driver, a repeater, discharge circuits, and a memory array; the memory array comprises a plurality of memory array blocks; and the discharge circuits are coupled with word lines in the memory array blocks. The method comprises: controlling the driver to output a first control signal to the repeater; and controlling the repeater to output a second control signal to a discharge circuit according to the first control signal.

In some embodiments, the repeater comprises a first transistor; and the controlling the repeater to output the second control signal to the discharge circuit according to the first control signal comprises: outputting the second control signal input at the first electrode of the first transistor from the second electrode of the first transistor to the discharge circuit after controlling the first electrode and the second electrode of the first transistor to be turned on according to the first control signal.

In some embodiments, the repeater further comprises a repeater select transistor; and the method further comprises: outputting the second control signal input at the first electrode of the repeater select transistor from the second electrode of the repeater select transistor to the first electrode of the first transistor after controlling the first electrode and the second electrode of the repeater select transistor to be turned on according to the repeater select signal.

In some embodiments, the controlling the driver to output the first control signal to the repeater comprises: controlling the driver to output the first control signal to the repeater according to the drive control signal.

In some embodiments, the method further comprises: controlling the driver to stop outputting the first control signal to the repeater according to a word line address of the word line.

In some embodiments, the discharge circuit comprises a seventh transistor; a first electrode of the seventh transistor is coupled with the word line; and the method further comprises: discharging a voltage of the word line through the first electrode and second electrode of the seventh transistor that are turned on after controlling the first electrode and the second electrode of the seventh transistor to be turned on according to the second control signal.

In some embodiments, the memory further comprises a charge circuit; the method further comprises: controlling the charge circuit to output a charge voltage to the word line according to the charge control signal.

In a third aspect, a memory system is provided. The memory system includes the above memory, and a controller coupled to the memory to control the memory to store data.

In some embodiments, the memory comprises a peripheral circuit and a memory array. The memory array is a two-dimensional array. The memory array and the peripheral circuit are fabricated on the same wafer.

In some embodiments, the memory comprises a peripheral circuit and a memory array. The memory array is a three-dimensional array. The memory array is fabricated on a first wafer; and the peripheral circuit is fabricated on a second wafer.

In a fourth aspect, an electronic device is provided. The electronic device includes the above memory system and a processor.

It would be understood that the beneficial effects that the drive method, memory system, and electronic device provided by the above embodiments of the present disclosure can achieve may refer to the beneficial effects of the above memory, which will not be repeated here.

BRIEF DESCRIPTION OF THE DRAWINGS

In order to more clearly explain the technical solutions of the present disclosure, the figures that need to be used in some embodiments of the present disclosure will be briefly introduced below. Obviously, the figures in the description below are only the figures in some embodiments of the present disclosure. Those ordinary skilled in the art may also obtain other figures according to these figures. In addition, the figures in the following description may be regarded as schematic diagrams, and are not intended to limit the actual size of the product, the actual flow of the method, the actual timing sequence of the signals, etc. involved in the embodiments of the present disclosure.

DETAILED DESCRIPTION

Figure 1:
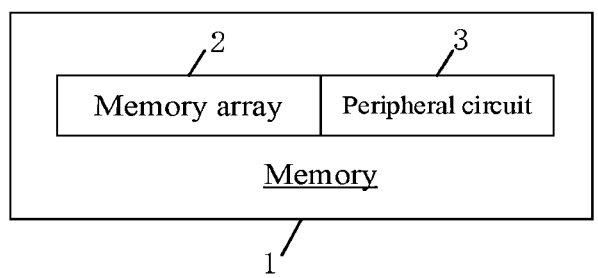
FIG. 1 is a block diagram of a memory according to some embodiments.

The technical solutions in some embodiments of the present disclosure will be described clearly and completely below in conjunction with the figures. Obviously, the described embodiments are only some embodiments of the present disclosure, but not all of the embodiments. Based on the embodiments provided by the present disclosure, all other embodiments obtained by those ordinary skilled in the art belong to the scope of protection of the present disclosure.

It should be understood in the description of the present disclosure that direction or position relationships indicated by terms such as "central," "upper," "lower," "front," "back," "left," "right," "vertical," "horizontal," "top," "bottom," "inner," "outer," etc. are those shown based on the figures, and are only intended to facilitate the description of the present disclosure and the simplification of the description rather than to indicate or imply that the indicated apparatus or element must have a specific direction, and is constructed and operated in the specific direction. Thus, they shall not be understood as a limitation to the present disclosure.

Unless otherwise required in the context, throughout the specification and claims, the term "comprise" is interpreted as open and inclusive, that is, "including, but not limited to." In the description of this specification, the terms "one embodiment," "some embodiments," "exemplary embodiments," "exemplarily," or "some examples" etc. are intended to indicate that the specific features, structures, materials or characteristics related to the embodiment or example are included in at least one embodiment or example of the present disclosure. The schematic expressions of the above terms do not necessarily refer to the same embodiments or examples. Furthermore, the said specific features, structures, materials or characteristics may be included in any suitable manner in any of one or more embodiments or examples.

Hereinafter, the terms "first" and "second" are only used for the purpose of description, rather than being understood to indicate or imply relative importance or designate the number of indicated technical features implicitly. Therefore, the feature limited by "first" and "second" can explicitly or impliedly comprise one or more of the feature. In the description of the embodiments of the present disclosure, the meaning of "a plurality of" is two or more unless otherwise specified.

When some embodiments are described, the terms "coupled" and "connected," along with their derivatives, may be used. For example, when some embodiments are described, the term "connected" may be used to indicate that two or more components are in direct physical or electrical contact with each other. For another example, when some embodiments are described, the term "coupled" may be used to indicate that two or more components are in direct physical contact or electrical contact. However, the term "coupled" may also mean that two or more components are not in direct contact with each other, but yet still co-operate or interact with each other. The embodiments disclosed herein are not necessarily limited to the disclosure herein.

"At least one of A, B and C" has the same meaning as "at least one of A, B or C," and both include the following combinations of A, B, and C: A, B, C, A and B, A and C, B and C, and A and B and C.

"A and/or B" includes the following three combinations: A, B, and A and B.

The use of "adapted to" or "configured to" herein means open and inclusive language, which does not exclude devices that are adapted to or configured to perform additional tasks or steps.

In addition, the use of "based on" means openness and inclusiveness, because the process, step, calculation or other actions "based on" the one or more conditions or values may be based on additional conditions or beyond the values in practice.

An embodiment of the present disclosure provides a memory. As shown in FIG. 1, the memory 1 comprises a memory array 2 and a peripheral circuit 3. The memory array 2 is coupled with the peripheral circuit 3. The memory array 2 is used to store data. The peripheral circuit 3 is used to read the data stored in the memory array 2, write the data into the memory array 2, or refresh the data stored in the memory array 2, or the like.

Figure 2:
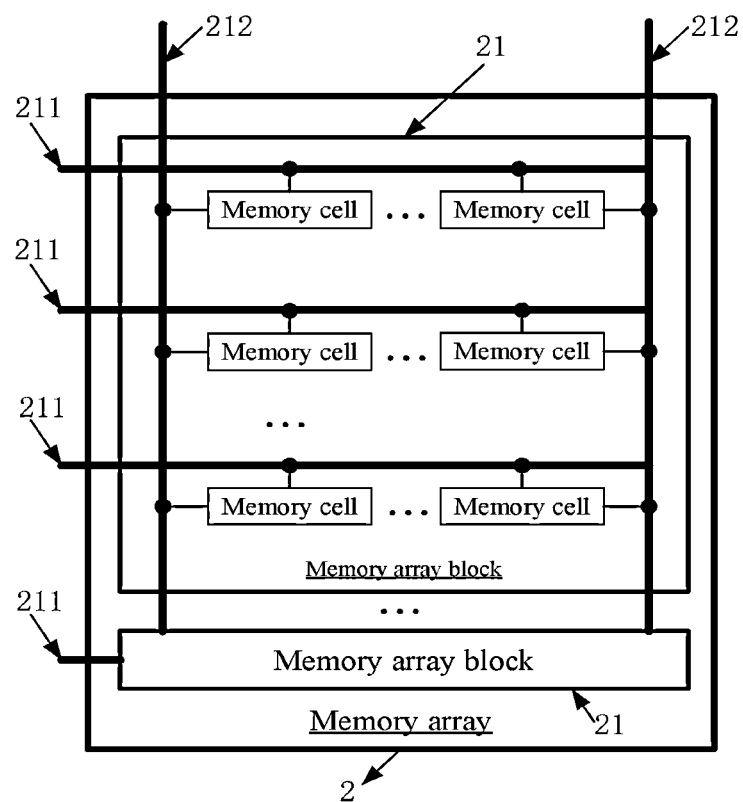
FIG. 2 is a block diagram of a memory array according to some embodiments.

Exemplarily, as shown in FIG. 2, the memory array 2 comprises a plurality of memory array blocks 21. Each memory array block 21 comprises a plurality of word lines 211, a plurality of bit lines 212, and a plurality of memory cells 213, where each memory cell 213 is coupled with a word line (WL) 211 and a bit line (BL) 212, respectively.

Optionally, one memory array block 21 may comprise 832 word lines 211, and of course, may comprise other numbers of word lines 211.

Figure 3:
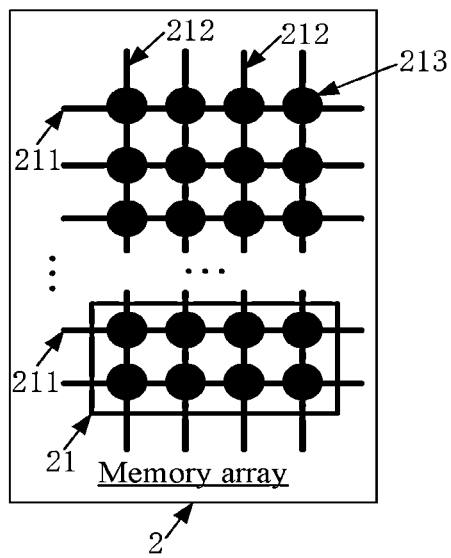
FIG. 3 is a two-dimensional diagram of a memory array according to some embodiments.

In some possible implementations, as shown in FIG. 3, the memory array 2 is a two-dimensional memory array.

Exemplarily, when the memory array 2 is a two-dimensional memory array, each memory array 2 is correspondingly coupled with a peripheral circuit 3. At this time, the memory 1 may be fabricated based on a wafer by etching, slicing and other processing operations. Optionally, one memory 1 comprises at least one memory array 2 and at least one peripheral circuit 3.

Figure 4:
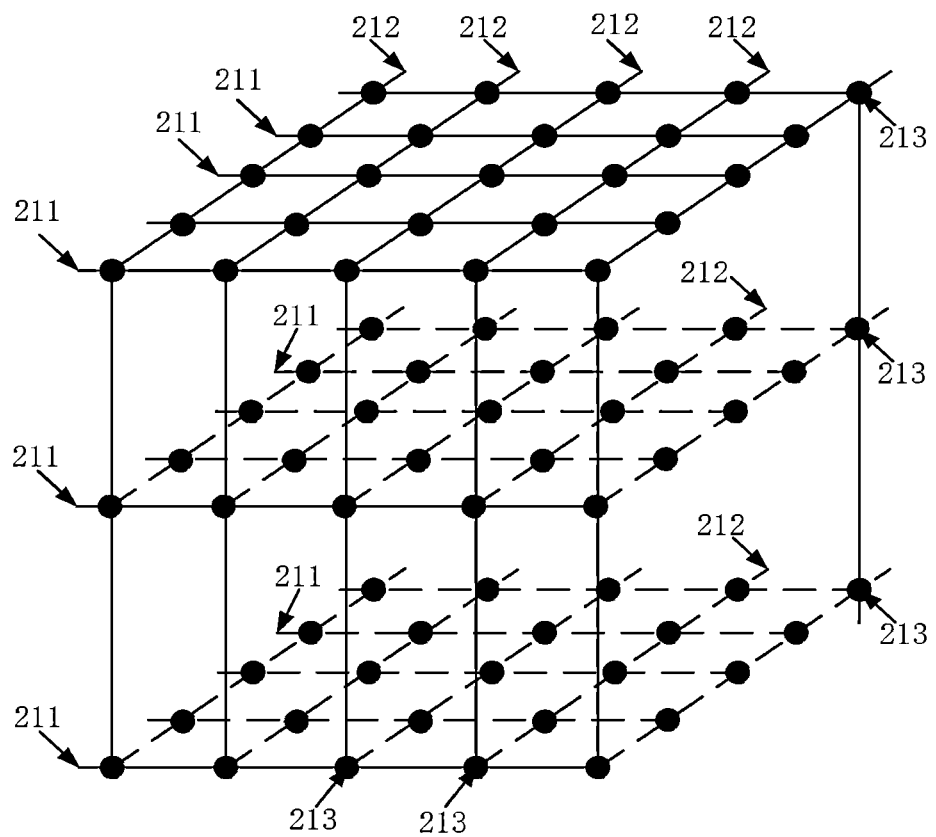
FIG. 4 is a three-dimensional diagram of a memory array according to some embodiments.

In some possible implementations, as shown in FIG. 4, the memory array 2 may be a three-dimensional memory array.

Exemplarily, when the memory array 2 is a three-dimensional memory array, the memory 1 may be fabricated based on a first wafer and a second wafer by etching, slicing and other processing operations, the memory array 2 may be fabricated from the first wafer, and the peripheral circuit 3 may be fabricated from the second wafer, where the memory array 2 and the peripheral circuit 3 are in bonding connection (also called electrical connection or binding connection).

In the following embodiments of the present disclosure, the word lines 211 in the memory array 2 are arranged in rows, and the bit lines 212 are arranged in columns. However, in practical applications, the word lines 211 may be arranged in columns, and the bit lines 212 may be arranged in rows.

Figure 5:
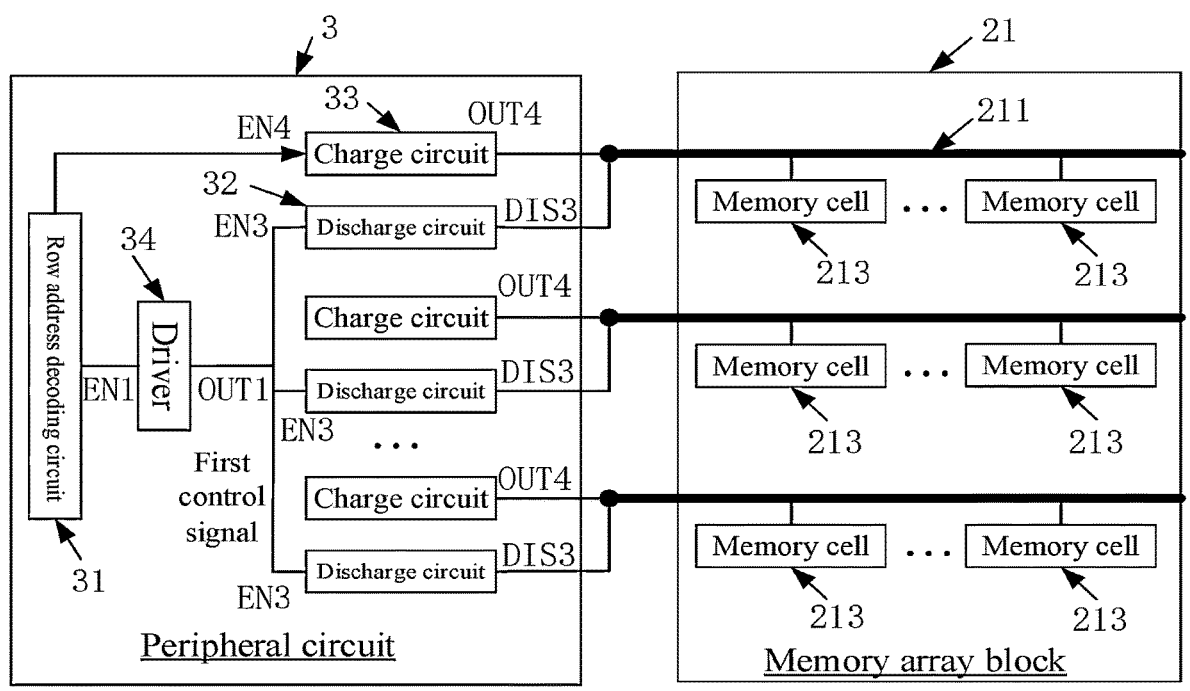
FIG. 5 is a block diagram of a peripheral circuit and a memory array block according to some embodiments.

In some possible implementations, as shown in FIG. 5, the peripheral circuit 3 comprises a row address decoding circuit 31, a plurality of discharge circuits 32, a plurality of charge circuits 33, and a driver 34. The row address decoding circuit 31 is coupled with a controlled terminal EN4 of the charge circuit 33 and a controlled terminal EN1 of the driver 34, respectively, and an output terminal OUT1 of the driver 34 is coupled with a controlled terminal EN3 of the discharge circuit 32. A discharge terminal DIS3 of the discharge circuit 32 and an output terminal OUT4 of the charge circuit 33 are respectively coupled with the word lines 211 in a memory array block 21.

Exemplarily, before programming the memory cells 213 on the word lines 211, the row address decoding circuit 31 controls the charge circuit 33 to precharge the word lines 211 through the output terminal OUT4. After the precharging, a programming operation is performed on the memory cells 213 to be programmed on the word line 211. After programming the memory cells 213 on the word line 211, the row address decoding circuit 31 outputs a drive control signal to the controlled terminal EN1 of the driver 34, to control the driver 34 to output a first control signal to the controlled terminal EN3 of the discharge circuit 32 through the output terminal OUT1, and drive the discharge circuit 32 by the first control signal to discharge the word line 211 through the discharge terminal DIS3.

In the embodiments of the present disclosure, since the memory array block 21 comprises a plurality of word lines 211, and each word line 211 needs to be provided with a corresponding discharge circuit 32, the driver 34 needs to simultaneously drive the plurality of discharge circuits 32 through the first control signal, which has high requirements for the drive capability of the first control signal output by the driver 34. The drive capability refers to the magnitude of load capability affected by the load magnitude of a later-stage device, which is mainly represented by the magnitude of a voltage requirement or the magnitude of current requirement, or the like. Taking the voltage requirement as an example, if a voltage required for the normal operation of the latter-stage device is 3V, the drive capability of a current-stage device means that after a voltage output by the current-stage device meets the requirement of overlapping the latter-stage device, under the influence of the load of the latter-stage device, the voltage will remain stable or the voltage will not be reduced below 3V due to the load of the latter-stage device. Taking the current requirement as an example, if a current required for the normal operation of the latter-stage device is 3 A, the drive capability of the current-stage device means that after a current output by the current-stage device meets the requirement of overlapping the latter-stage device, under the influence of the load of the latter-stage device, the current will remain stable or the current will not be reduced below 3 A due to the load of the latter-stage device. When the drive capability of the first control signal is smaller, it will take a longer time (i.e., longer drive response time) to raise the voltage to the level required for the normal operation of the discharge circuit 32. In the actual chip design routing of the memory 1, word lines 211 and memory cells 213 in the memory array 2 are often closely routed, and the peripheral circuit 3 is designed and routed according to the memory array 2. Under the actual chip design routing, the coupling between the output terminal OUT1 of the driver 34 and the controlled terminal EN3 of the discharge circuit 32 is realized by a routing metal line. The routing metal line is not a straight routing metal line as in the circuit schematic diagram, which directly realizes the coupling between the driver 34 and the discharge circuit 32, but is an annular complex routing metal line that is set according to the close routing of the driver 34 and the discharge circuit 32 on the chip. Generally, there is a certain distance between the driver 34 and the discharge circuit 32, and the routing metal line between the two is also long. In this case, the number of discharge circuits 32 is large, which has a certain requirement for the drive capability of the first control signal output by the driver 34 to the discharge circuits 32. In the process of transmitting the first control signal to the discharge circuit 32 through a certain length of a routing metal line, the routing metal line has a certain load, which will cause a certain loss to the first control signal, and this loss will increase with the increase of the length of the routing metal line. Therefore, it still takes a certain time for the first control signal to reach the level of capable driving the discharge circuit 32 to operate quickly after reaching the discharge circuit 32. Therefore, a longer discharge time is required in the process of outputting the first control signal by the driver 34 to drive the discharge circuit 32 until the discharge circuit 32 completes the discharge operation performed on the word line.

Figure 6:
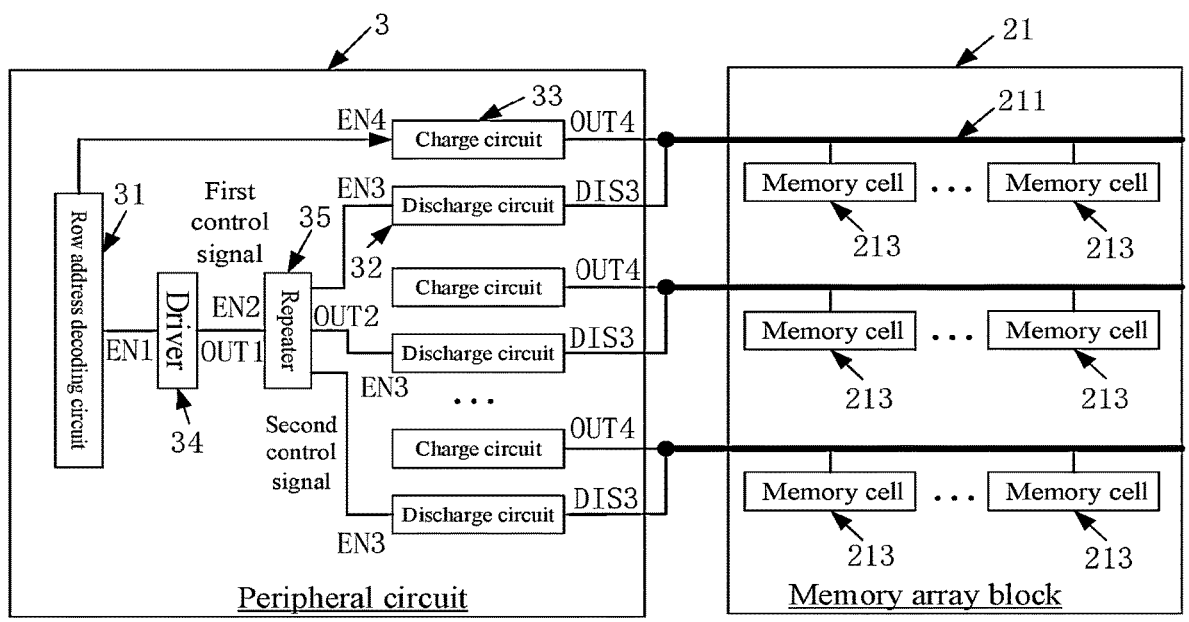
FIG. 6 is a block diagram of another peripheral circuit and a memory array block according to some embodiments.

To reduce the discharge time of the discharge circuit 32, an embodiment of the present disclosure further provides a peripheral circuit 3. As shown in FIG. 6, the peripheral circuit 3 comprises a row address decoding circuit 31, discharge circuits 32, charge circuits 33, a driver 34, and a repeater 35. The row address decoding circuit 31 is coupled with a controlled terminal EN4 of the charge circuit 33 and a controlled terminal EN1 of the driver 34, respectively, an output terminal OUT1 of the driver 34 is coupled with a controlled terminal EN2 of the repeater 35, and an output terminal OUT2 of the repeater 35 is coupled with a controlled terminal EN3 of the discharge circuit 32. A discharge terminal DIS3 of the discharge circuit 32 and an output terminal OUT4 of the charge circuit 33 are respectively coupled with a word line 211 in a memory array block 21.

Exemplarily, before programming the memory cells 213 on the word line 211, the row address decoding circuit 31 controls the charge circuit 33 to precharge the word line 211. After the precharging, a programming operation is performed on the memory cells 213 to be programmed on the word line 211. After programming the memory cells 213 on the word line 211, the row address decoding circuit 31 outputs a drive control signal to the driver 34, to control the driver 34 to output a first control signal to the repeater 35. According to the received first control signal, the repeater 35 outputs a second control signal to the controlled terminal EN3 of the discharge circuit 32, to drive the discharge circuit 32 by the second control signal to discharge the precharged word line 211.

In an embodiment of the present disclosure, the driver 34 no longer directly drives the discharge circuit 32, the first control signal is used to trigger the repeater 35, and then the triggered repeater 35 drives the discharge circuit 32. In this implementation, the requirement for the drive capability of the driver 34 is reduced. Meanwhile, after the driver 34 outputs the first control signal to the repeater 35, the first control signal reaches the repeater 35 through a certain length of a routing metal line. At this time, the second control signal output by the repeater 35 controlled by the first control signal can reach the discharge circuit 32 only through a remaining length of the routing metal line and drive the discharge circuit 32. In this process, the length of the routing metal line through which the second control signal actually used to drive the discharge circuit 32 is transmitted is reduced, so the speed at which the discharge circuit 32 is driven to normally perform the discharge operation is increased. In addition, in the structure shown in FIG. 5, the routing metal line through which the first control signal passes is designed according to a larger distance between the driver 34 and the discharge circuit 32, so there are many factors to consider when designing the routing metal line between the driver 34 and the discharge circuit 32, and the line routing is more complicated. In the structure shown in FIG. 6, since the repeater 35 is added, in the actual chip routing design, a routing metal line through which the first control signal passes may be designed according to the positions of the driver 34 and the repeater 35, and a routing metal line through which the second control signal passes may be designed according to the positions of the repeater 35 and the discharge circuit 32, which makes the design of routing metal lines simpler. In the case where there is a certain distance between the driver 34 and the repeater 35, the distance between the repeater 35 and the discharge circuit 32 is shortened with respect to the distance between the driver 34 and the discharge circuit 32. Since the distance between the repeater 35 and the discharge circuit 32 is shorter, there are fewer routing factors to consider when designing routing metal lines. In this way, the routing metal line through which the second control signal passes may be designed to be shorter, thereby further improving the discharge speed of the discharge circuit 32.

In some possible implementations, one memory array 2 may comprise a plurality of memory banks, each memory bank may comprise a plurality of memory array blocks 21, and the number of drivers 34 may be correspondingly set according to the number of memory banks, such as one or two times the number of memory banks. The number of repeaters 35 may be correspondingly set according to the number of one memory array block 21, such as one or two times the number of the memory array block 21. The number of discharge circuits 32, and the number of charge circuits 33 may correspond to the number of word lines 211 in the memory array 2. For example, each word line 211 is correspondingly coupled with one discharge circuit 32 and one charge circuit 33.

Figure 7:
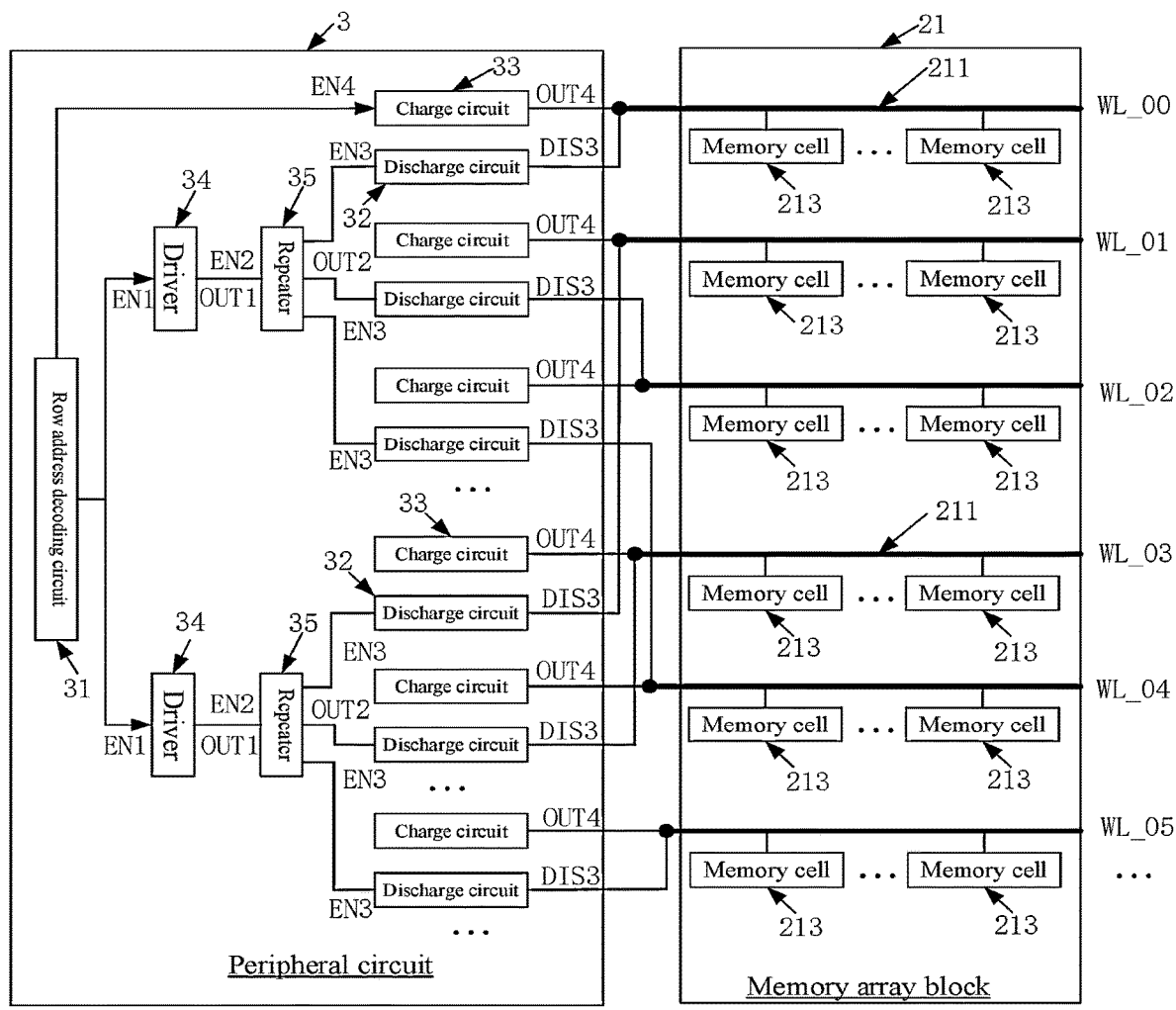
FIG. 7 is a block diagram of another peripheral circuit and a memory array block according to some embodiments.

Exemplarily, as shown in FIG. 7, for one memory array block 21 in the memory array 2, one row address decoding circuit 31, two drivers 34, two repeaters 35, and discharge circuits 32 and charge circuits 33 corresponding to the word lines 211 in number may be correspondingly disposed in the peripheral circuit 3. Each memory array block 21 corresponds to two repeaters 35, which may be divided into a repeater 35 with an odd row address and a repeater 35 with an even row address, where an output terminal OUT2 of the repeater 35 with the odd row address is coupled with controlled terminals EN3 of discharge circuits 32 with odd row addresses, the discharge circuits 32 with odd row addresses referring to a plurality of discharge circuits 32 coupled with word lines 211 with odd row addresses in the memory array block 21. An output terminal OUT2 of the repeater 35 with the even row address is coupled with controlled terminals EN3 of discharge circuits 32 with even row addresses, the discharge circuits 32 with even row addresses referring to a plurality of discharge circuits 32 coupled with word lines 211 with even row addresses in the memory array block 21. In the figure, WL_xx refers to a row address of a word line 211, where WL is the abbreviation of the word line, and xx is used to explain the row address of the corresponding word line 211. For example, WL_00 represents a word line 211 of an even row address with a row address 00, WL_01 represents a word line 211 of an odd row address with a row address 01, and so on.

In the embodiments of the present disclosure, since word lines 211 are divided according to row addresses, word lines 211 with odd row addresses and word lines 211 with even row addresses are spaced word lines 211 in the actual routing. By setting different drivers 34 for the spaced word lines 211, which be driven independently, the voltage interference between the spaced word lines 211 may be reduced, and it is also more convenient for programming control.

Exemplarily, the above-mentioned mode of dividing the word lines 211 in the memory array 2 according to odd row addresses and even row addresses, and correspondingly providing different drivers 34, etc., is only an example of one implementation. In practical applications, the word lines 211 in the memory array 2 may also be divided according to address areas, and then different drivers 34 may correspond to word lines 211 in different address areas.

Figure 8:
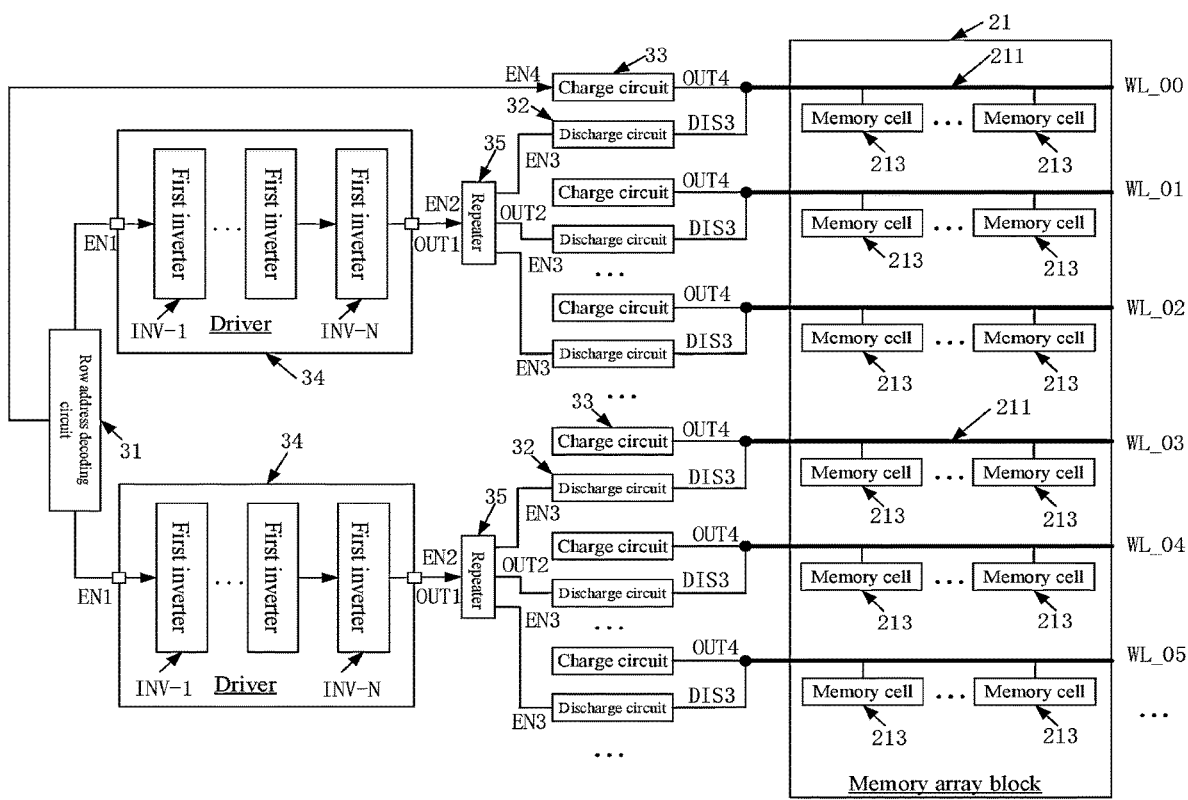
FIG. 8 is a block diagram of another peripheral circuit and a memory array block according to some embodiments.

In some possible implementations, as shown in FIG. 8, the driver 34 comprises a controlled terminal EN1 and a plurality of cascaded inverters INV. The driver 34 is coupled with the row address decoding circuit 31 by the controlled terminal EN1 to input a drive control signal. A controlled terminal of a first-stage inverter INV-1 of the plurality of cascaded inverters INV is coupled with the controlled terminal EN1 of the driver 34; and an output terminal of a last-stage inverter INV-N of the plurality of cascaded inverters INV is coupled with the controlled terminal EN2 of the repeater 35, where N at the end of the reference numeral INV-N represents the number of the cascaded inverters INV.

Optionally, the number of the plurality of inverters INV may be two, three, four, five, etc. For example, in FIG. 9, four inverters INV-1 to INV-4 are shown in the driver 34, and a controlled terminal of the inverter INV-1 is coupled with the controlled terminal EN1 of the driver 34 to input a drive control signal through the controlled terminal EN1 of the driver 34; an output terminal of the inverter INV-1 is coupled with a controlled terminal of the inverter INV-2; an output terminal of the inverter INV-2 is coupled with a controlled terminal of the inverter INV-3; an output terminal of the inverter INV-3 is coupled with a controlled terminal of the inverter INV-4; and an output terminal of the inverter INV-4 is coupled with the output terminal OUT1 of the driver 34, and is coupled to the repeater 35 by the output terminal OUT1 of the driver 34.

In the embodiments of the present disclosure, the input drive control signal is inverted several times by a plurality of inverters INV to obtain a first control signal and output the same to a corresponding repeater 35. In this process, the specific number of the plurality of inverters INV may be adaptively adjusted according to the levels of the drive control signal and the first control signal in practical applications. For example, when the input drive control signal is at the low level, the first control signal to be output is also at the low level; alternatively, when the input drive control signal is at the high level, the first control signal to be output is also at the high level; in both cases, if the levels of the drive control signal and the first control signal are identical, even number of inverters INV may be set. On the contrary, when the input drive control signal is at the low level, the first control signal to be output is at the high level; alternatively, when the input drive control signal is at the high level, the first control signal to be output is at the low level; in both cases, if the levels of the drive control signal and the first control signal are opposite, odd number of inverters INV may be set. In practical applications, odd number of inverters INV correspond to the logics of the input signal and output signal, which have opposite levels, and even number of inverters INV correspond to the logics of the input signal and output signal, which have identical levels. Therefore, theoretically, the logic control functions of the odd number of inverters INV are identical regardless of the number of inverters INV. Similarly, the logic control functions of even number of inverters INV are also identical regardless of the number of inverters INV. However, in practical applications, if only one inverter INV is used, there is a problem of excessively fast inversion between the input drive control signal and the output first control signal, thereby causing the output signal to be unstable. Therefore, although the functions of the odd number of inverters INV are identical in control logic, setting a plurality of inverters INV may increase a certain time delay, and the output may be corrected in real time through the time delay, thereby avoiding the problems of excessively fast inversion speed and unstable output when the output is inverted repeatedly in the case where a single inverter INV performs outputting. The functions of even number of cascaded inverters INV are equivalent to the case where no inverter INV is set in output signal logic. However, even number of inverters INV can form an oscillator, so that the output voltage signal can reach a steady state and voltage competition can be avoided. In general applications, two, three, four, or five inverters INV, etc., may be selectively set. If the number of inverters INV is too large, problems such as waste of power consumption, increase of cost, an increase of delay, or the like may be caused.

Figure 9:
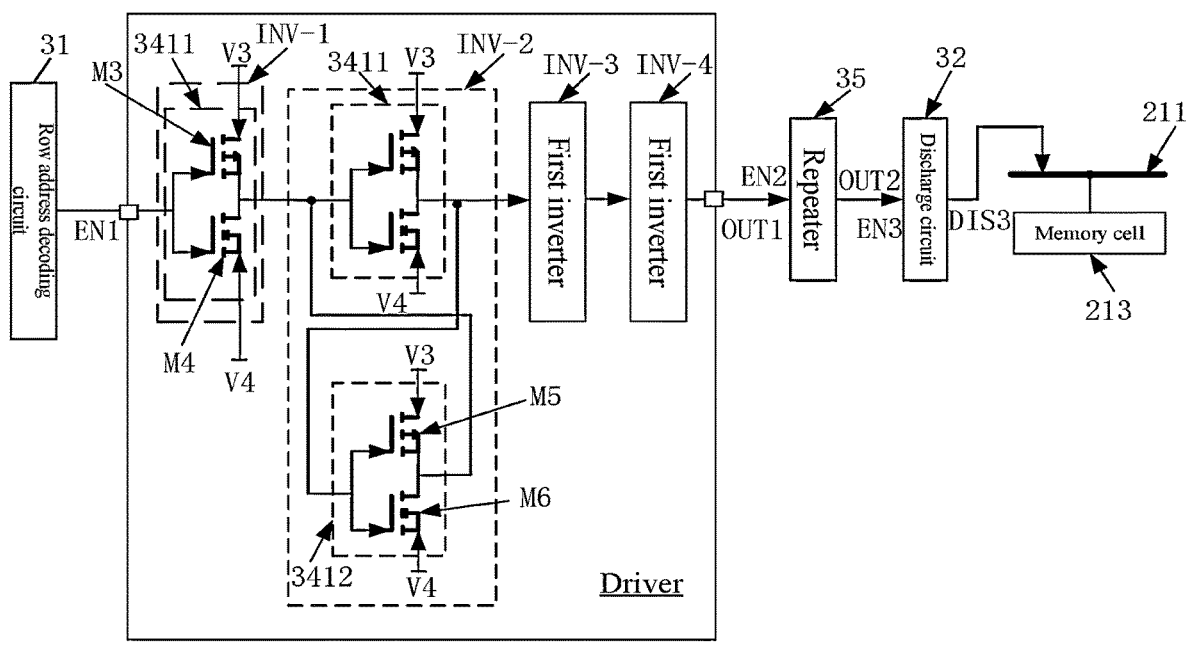
FIG. 9 is a block diagram of a peripheral circuit according to some embodiments.

In some possible implementations, as shown in FIG. 9, the driver 34 further comprises a third voltage terminal V3 and a fourth voltage terminal V4. The third voltage terminal V3 is used to input a first voltage signal. The fourth voltage terminal V4 is used to input a second voltage signal. Any of the plurality of inverters INV comprises a first inverter circuit 3411; the first inverter circuit 3411 comprises a third transistor M3 and a fourth transistor M4; a first electrode of the third transistor M3 is coupled with the third voltage terminal V3, to input the first voltage signal; a first electrode of the fourth transistor M4 is coupled with the fourth voltage terminal V4, to input the second voltage signal; a gate of the third transistor M3 and a gate of the fourth transistor M4 are coupled and then used together as a controlled terminal of the first inverter circuit 3411; and a second electrode of the third transistor M3 and a second electrode of the fourth transistor M4 are coupled and then used together as an output terminal of the first inverter circuit 3411.

Exemplarily, as shown in FIG. 9, one first inverter circuit 3411 can be formed by the third transistor M3 and the fourth transistor M4, where one of the third transistor M3 and the fourth transistor M4 is a P-Metal-Oxide-Semiconductor (PMOS), and the other is an N-Metal-Oxide-Semiconductor (NMOS). The gates of the two transistors are used together as a controlled terminal of the first inverter circuit 3411, and the second electrodes of the two transistors are used together as an output terminal of the first inverter circuit 3411. Taking the third transistor M3 as a PMOS transistor and the fourth transistor M4 as an NMOS transistor as an example, the third voltage terminal V3 is used to input the first voltage signal (e.g., at the high level) to the first electrode of the third transistor M3. The fourth voltage terminal V4 is used to input the second voltage signal (e.g., at the low level) to the first electrode of the fourth transistor (NMOS transistor) of the first inverter circuit 3411. When the low level is input to a controlled terminal of one inverter INV, the third transistor M3 (PMOS transistor) is turned on and the fourth transistor M4 is turned off, and an output terminal of the inverter INV outputs the first voltage signal to a next-stage inverter INV through the second electrode of the third transistor M3, thus realizing the level inversion from the input signal to the output signal. Similarly, after the first voltage signal at the high level is input to the controlled terminal of the next-stage inverter INV, in the case where the gate is applied with the high level, a third transistor M3 of the next-stage inverter INV is turned off, and a fourth transistor M4 is turned on, so that the next-stage inverter INV outputs the second voltage signal through the second electrode of the fourth transistor M4, so as to realize the level inversion from the input first voltage signal to the output second voltage signal.

Exemplarily, as shown in FIG. 9, taking the driver 34 comprising four cascaded inverters INV as an example, the drive control signal input to the driver 34 and the first control signal output by the driver 34 have identical levels. Taking the drive control signal and the first control signal, which are at the low level as an example, a first-stage inverter INV is used to control the third transistor M3 (e.g., PMOS transistor) to output the first voltage signal (e.g., at the high level) through the drive control signal (e.g., at the low level).

In some possible implementations, as shown in FIG. 9, any of the plurality of inverters INV comprises a second inverter circuit 3412. The second inverter circuit 3412 comprises a fifth transistor M5 and a sixth transistor M6. A first electrode of the fifth transistor M5 is coupled with the third voltage terminal V3, to input the first voltage signal; a first electrode of the sixth transistor M6 is coupled with the fourth voltage terminal V4, to input the second voltage signal; a gate of the fifth transistor M5 and a gate of the sixth transistor M6 are coupled and then used together as a controlled terminal of the second inverter circuit 3412; a second electrode of the fifth transistor M5 and a second electrode of the sixth transistor M6 are coupled and then used together as an output terminal of the second inverter circuit 3412; the output terminal of the second inverter circuit 3412 is coupled with a controlled terminal of a first inverter circuit 3411 in the corresponding inverter INV; and the controlled terminal of the second inverter circuit 3412 is coupled with an output terminal of the first inverter circuit 3411 in the corresponding inverter INV.

Exemplarily, each of the first inverter circuit 3411 and the second inverter circuit 3412 comprises an NMOS transistor and a PMOS transistor. However, an output terminal of the second inverter circuit 3412 is coupled to a controlled terminal of the first inverter circuit 3411, and a controlled terminal of the second inverter circuit 3412 is coupled to an output terminal of the first inverter circuit 3411. In this coupling mode, the first inverter circuit 3411 and the second inverter circuit 3412 form a cross-coupled inverter structure, in which the output of the first inverter circuit 3411 is made more stable by the second inverter circuit 3412.

Exemplarily, the drive capability of the second inverter circuit 3412 as an inverter is lower than that of the first inverter circuit 3411.

Exemplarily, taking the driver 34 comprising three cascaded inverters INV as an example, the first stage inverter INV-1 and the third-stage inverter INV-3 may be configured to be a structure comprising the first inverter circuit 3411, and the second-stage inverter INV-2 may be configured to be a structure comprising the first inverter circuit 3411 and the second inverter circuit 3412. When the driver 34 comprises four cascaded inverters INV, the second-stage inverter INV-2 or the third-stage inverter INV-3 may be configured to be a structure comprising the first inverter circuit 3411 and the second inverter circuit 3412.

In the embodiments of the present disclosure, by providing the second inverter circuit 3412, the operation of the driver 34 can be made more stable. Theoretically, any inverter INV in the driver 34 may be configured to comprise the second inverter circuit 3412. However, too many second inverter circuits 3412 will increase the processing delay of the driver 34, so it is only necessary to provide the second inverter circuit 3412 in a cascaded intermediate-stage inverter INV.

Figure 10:
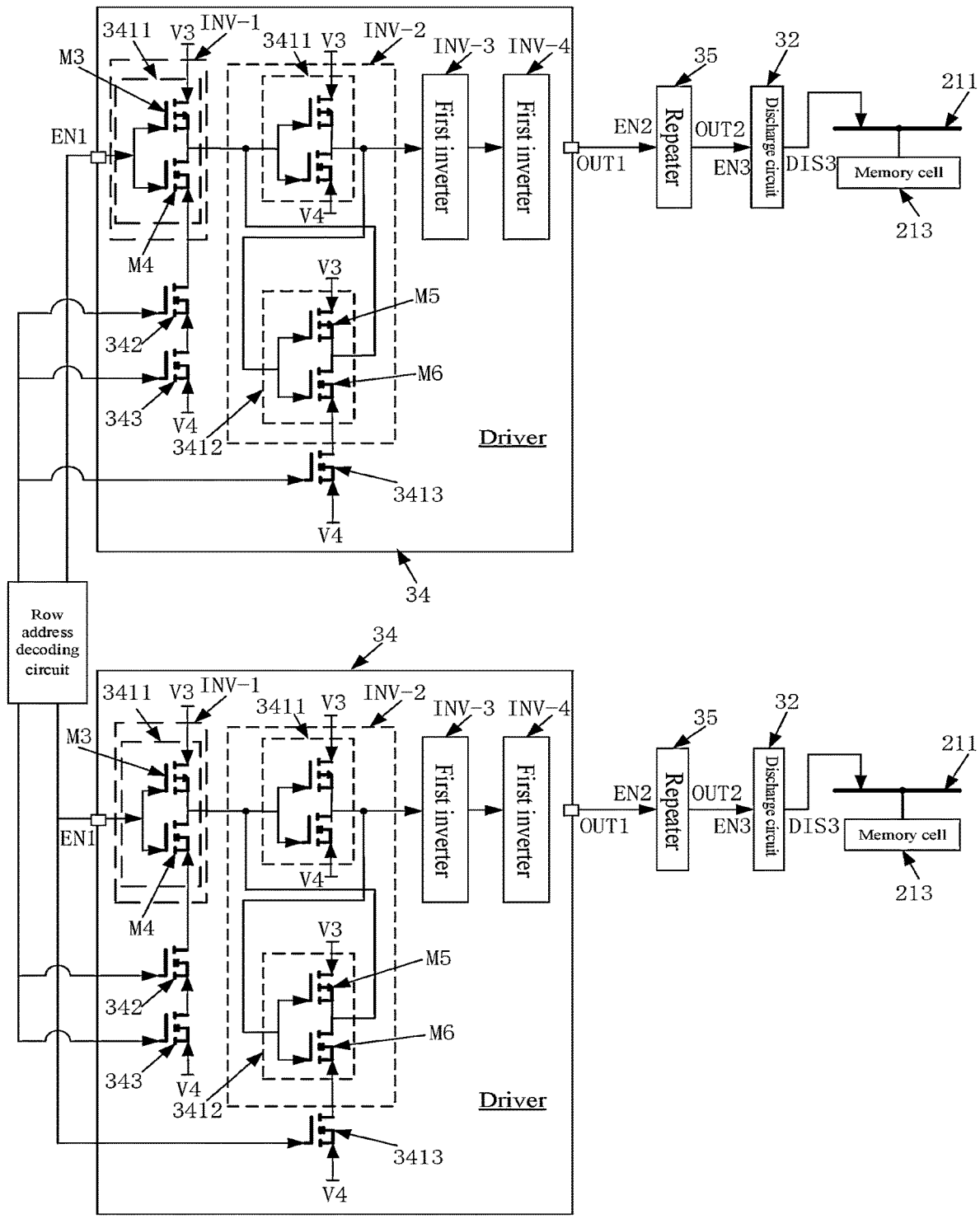
FIG. 10 is a block diagram of another peripheral circuit according to some embodiments.

In some possible implementations, as shown in FIG. 10, the inverter INV provided with the second inverter circuit 3412 may further comprise a drive turn-on transistor 3413. The second inverter circuit 3412 is coupled with the fourth voltage terminal V4 of the driver 34 by the drive turn-on transistor 3413. The drive turn-on transistor 3413 is used to control whether the second inverter circuit 3412 inputs the second voltage signal under the control of the drive control signal.

Exemplarily, as shown in FIG. 10, taking the drive turn-on transistor 3413, which is an NMOS transistor and coupled to the second inverter circuit 3412 of the second-stage inverter INV-2 as an example, if the discharge circuit 32 is controlled to discharge when the repeater 35 outputs the second control signal (e.g., at the high level), the discharge circuit 32 is controlled not to discharge when the repeater 35 outputs a third control signal (e.g., at the low level), then when the input drive control signal is at the high level, the first-stage inverter INV-1 outputs a second voltage signal to the second-stage inverter INV-2; and the first inverter circuit 3411 of the second-stage inverter INV-2 outputs the first voltage signal to the third-stage inverter INV-3, and outputs the first voltage signal to the controlled terminal of the second inverter circuit 3412 of the second-stage inverter INV-2. The sixth transistor M6 of the second inverter circuit 3412 is the NMOS transistor and is turned on under the control of the first voltage signal. At this time, if the drive turn-on transistor 3413 is turned on under the control of the drive control signal, then the second voltage signal may be input normally in the case where the sixth transistor M6 of the second inverting circuit 3412 is turned on, to make the second-stage inverter INV-2 operate more stably.

In the embodiments of the present disclosure, according to different requirements for levels of the input drive control signal and the output first control signal in different application scenarios, the drive turn-on transistor 3413 may be configured as a PMOS transistor or an NMOS transistor accordingly, and the drive turn-on transistor 3413 may also be coupled to the fifth transistor M5 or the sixth transistor M6 of the second inverter circuit 3412.

In some possible implementations, as shown in FIG. 10, when a plurality of drivers 34 are provided, each driver 34 further comprises an address select switching transistor 342. The address select switching transistor 342 is coupled with the row address decoding circuit 31 to input an address select signal. The address select switching transistor 342 may be coupled to any of the plurality of inverters INV. The address select switching transistor 342 is used to control the plurality of inverters INV to stop outputting the first control signal according to the address select signal.

Exemplarily, as shown in FIG. 10, the address select switching transistor 342 may be the NMOS transistor. An output terminal of the row address decoding circuit 31 is coupled with the gates of the address select switching transistors 342 of all drivers 34 in one memory array block 21, respectively. When an address select signal (e.g., at the high level) is input to the gate of the address select switching transistor 342, the address select switching transistor 342 is turned on, so that the driver 34 outputs the first control signal or stops outputting the first control signal.

Exemplarily, taking the driver 34 provided therein with cascaded inverters INV of four stages as an example, the address select switching transistor 342 may be coupled to the first electrode of the fourth transistor M4 (e.g., NMOS transistor) of the first-stage inverter INV-1, and whether a second voltage signal (e.g., at the low level) is input to the first electrode of the fourth transistor M4 or not may be controlled by whether the address select switching transistor 342 is turned on or not, that is, it may be controlled that whether the driver 34 outputs a signal at the high level or not. Similarly, the controlled terminal of the second-stage inverter INV is input with the second voltage signal provided by the first-stage inverter INV-1, and the first voltage signal (e.g., at the high level) is output by the second electrode of the third transistor M3 (e.g., PMOS transistor) of the second-stage inverter INV-2. Therefore, the address select switching transistor 342 can also be coupled to the first electrode of the third transistor M3 of the second-stage inverter INV-2 to control the second-stage inverter INV-2 to stop outputting the first voltage signal. Similarly, for the third-stage inverter INV-3 and the fourth-stage inverter INV-4, refer to the previous description of the first-stage inverter IVN-1 and the second-stage inverter INV-2. In four cascaded inverters INV, whether odd number of inverters INV or even number of inverters INV are provided in the driver 34 may be adaptively adjusted according to identical levels of the drive control signal and the first control signal, opposite levels of the drive control signal and the first control signal, etc. For the specific adjustment principle, refer to the above principle analysis, which will not be repeated here.

In the above embodiments of the present disclosure, the first control signal can only be generated when a plurality of cascaded inverters INV act together, and the first control signal cannot be generated when any of the inverters cannot operate under a corresponding control logic. The address select switching transistor 342 may be coupled to any of the plurality of inverters INV, and then an address select signal is outputted by the row address decoding circuit 31 to the address select switching transistor 342, to control whether to turn on the address select switching transistor 342. According to different setting positions of address select switching transistors 342 and different numbers of inverters INV, the following function may be implemented, i.e., a corresponding driver 34 may be controlled to stop outputting the first control signal, or the corresponding driver 34 may be controlled to output the first control signal. According to actual application scenario requirements, the coupling position of the address select switching transistor 342 may be adaptively adjusted.

In some possible implementations, the second control signal and the first control signal have identical levels.

In the embodiments of the present disclosure, the repeater 35 is used to regenerate the second control signal according to the first control signal, but the levels of the first control signal and the second control signal are not changed.

In some possible implementations, the second control signal and the first control signal have opposite levels.

In some possible implementations, as shown in FIG. 10, the driver 34 further comprises a condition select switching transistor 343. The condition select switching transistor 343 is coupled to any of the plurality of inverters INV. The condition select switching transistor 343 is controlled by a condition select signal to control whether the driver 34 outputs the first control signal.

In the embodiments of the present disclosure, in actual applications, because of the application scenario, the driver 34 may be allowed to output the first control signal only when certain conditions are met, but it is necessary to control the driver 34 not to output the first control signal before these conditions are met. At this time, the condition select switching transistor 343 may be provided to control whether the driver 34 outputs the first control signal according to the condition select signal.

Exemplarily, for the description of the principle of the condition select switching transistor 343, refer to the foregoing description of the address select switching transistor 342. According to the foregoing description, the setting position of the address select switching transistors 342 is different, which can implement that: when the word line 211 to be discharged belongs to a certain address, the corresponding address select switching transistors 342 is controlled to be turned on by the address select signal to control the driver 34 to output the first control signal. Alternatively, when the word line 211 of the certain address does not need to be discharged, the corresponding address select switching transistors 342 is controlled to be turned on by the address select signal to control the driver 34 not to output the first control signal, and so on. The condition select signal of the address select switching transistor 343 may be a control signal corresponding to factors other than row address-based information. In the actual structure, the selection of the coupling position of the condition select switching transistor 343 may refer to the technical description of the address select switching transistor 342 mentioned above. The condition select switching transistor 343 and the address select switching transistor 342, when coupled to the same inverter INV, can be connected in series, or can be coupled to different transistors to implement control under different conditions.

Exemplarily, for the plurality of cascaded inverters INV, the transistor size of the last-stage inverter INV is larger than that of the previous-stage inverter INV.

In the embodiments of the present disclosure, according to the above-mentioned principle analysis on a plurality of cascaded inverters INV, it can be known that the previous-stage inverter INV only plays a role in driving the later-stage inverter to output signals with opposite levels, while the last-stage inverter INV-N needs to output the first control signal to drive the repeater 35. A larger transistor size can make the first control signal have a larger drive capability.

Figure 11:
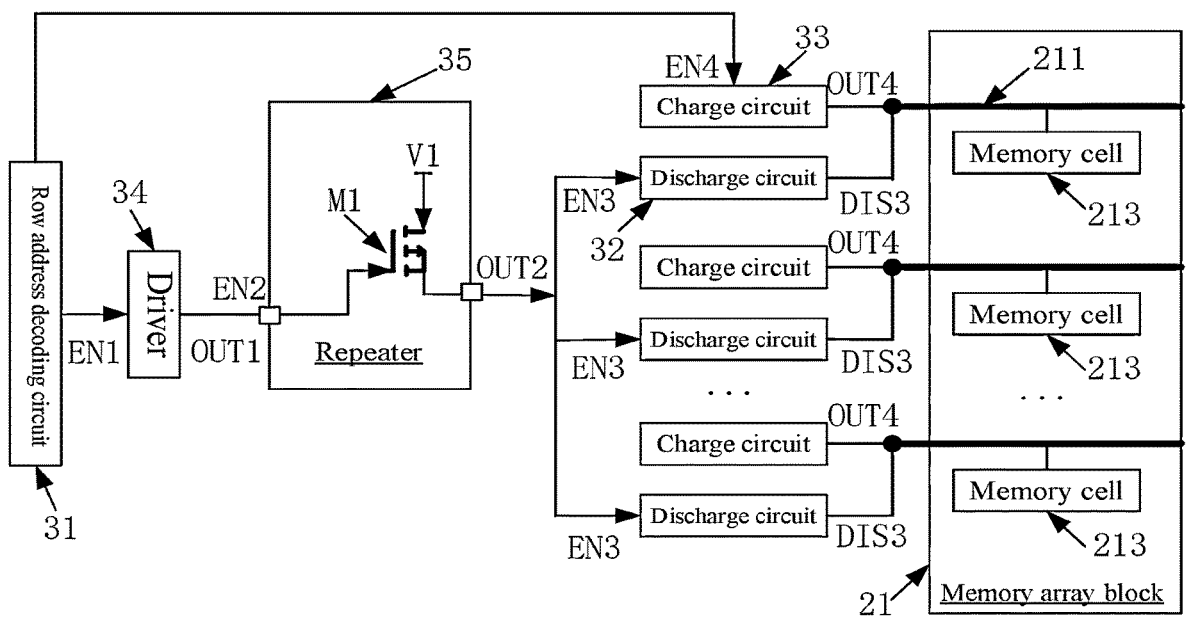
FIG. 11 is a block diagram of another peripheral circuit according to some embodiments.

In some possible implementations, as shown in FIG. 11, the repeater 35 comprises a first transistor M1 and a first voltage terminal V1. A gate of the first transistor M1 is coupled with the controlled terminal EN2 of the repeater 35; a first electrode of the first transistor M1 is coupled with the first voltage terminal V1; and the first voltage terminal V1 is used to input a second control signal.

Exemplarily, taking the first transistor M1 as a PMOS transistor as an example, the driver 34 outputs a first control signal (e.g., at the low level) to the controlled terminal EN2 of the repeater 35, and the first control signal enables the first transistor M1 (PMOS transistor) to be turned on. The first electrode of the first transistor M1 is coupled to the first voltage terminal V1 to input the second control signal, and the turned-on first transistor M1 outputs the second control signal input to the first electrode to the output terminal OUT2 of the repeater 35 through the second electrode of the second transistor M2, and outputs the second control signal from the output terminal OUT2 of the repeater 35 to the controlled terminal EN3 of the discharge circuit 32 to control the discharge circuit 32 to discharge the word line 211 through the discharge terminal DIS3.

Exemplarily, taking the first transistor M1 as an NMOS transistor as an example, the driver 34 outputs a first control signal (e.g., at the high level) to the controlled terminal EN2 of the repeater 35, and the first control signal enables the first transistor M1 to be turned on. The first electrode of the first transistor M1 is coupled to the first voltage terminal V1 to input the second control signal, and the turned-on first transistor M1 outputs the second control signal input at the first electrode to the output terminal OUT2 of the repeater 35 through the second electrode of the second transistor M2, and outputs the second control signal from the output terminal OUT2 of the repeater 35 to the controlled terminal EN3 of the discharge circuit 32 to control the discharge circuit 32 to discharge the word line 211 through the discharge terminal DIS3.

Figure 12:
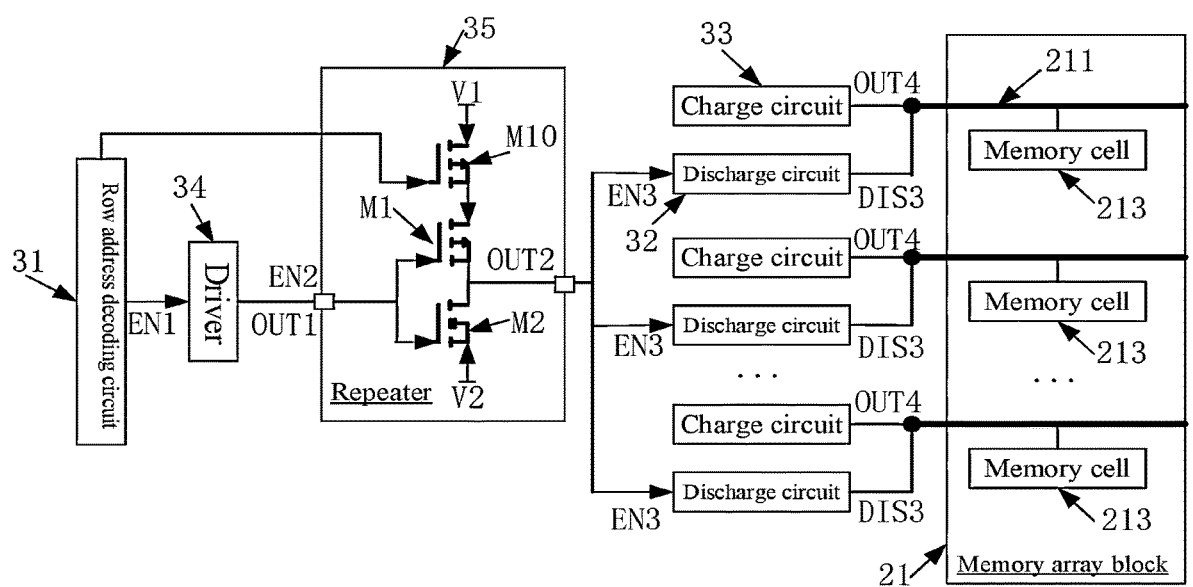
FIG. 12 is a block diagram of another peripheral circuit according to some embodiments.

In some possible implementations, as shown in FIG. 12, the repeater 35 further comprises a second transistor M2 and a second voltage terminal V2. A gate of the second transistor M2 is coupled with the controlled terminal EN2 of the repeater 35; a first electrode of the second transistor M2 is coupled with the second voltage terminal V2; the second voltage terminal V2 is used to input a third control signal; and a second electrode of the second transistor M2 is coupled with the output terminal OUT2 of the repeater 35.

Exemplarily, when the first transistor M1 is a PMOS transistor, the second transistor M2 may be an NMOS transistor; and when the first transistor M1 is the NMOS transistor, the second transistor M2 may be the PMOS transistor.

In the embodiments of the present disclosure, the first control signal is used to turn on the second transistor M2, the turned-on second transistor M2 is used to output the third control signal to the output terminal OUT2 of the repeater 35, the output terminal OUT2 of the repeater 35 outputs the third control signal to the controlled terminal EN3 of the discharge circuit 32, and the discharge circuit 32 does not discharge the word line 211 under the control of the third control signal. Setting the first transistor M1 and the second transistor M2 as different types of transistors can ensure that the first control signal will not turn on the first transistor M1 and the second transistor M2 simultaneously.

In some possible implementations, as shown in FIG. 12, the repeater 35 further comprises a repeater select transistor M10. A first electrode of the repeater select transistor M10 is coupled with the first voltage terminal V1 to input a first voltage signal; a second electrode of the repeater select transistor M10 is coupled with the first electrode of the first transistor M1; a gate of the repeater select transistor M10 is used to input a repeater select signal; the repeater select signal is used to control whether the repeater select transistor M10 is turned on or not; and the first electrode of the first transistor M1 is used to couple with the first voltage terminal V1 through the turned-on repeater select transistor M10 to input a second voltage signal.

In the embodiment of the present disclosure, the repeater select transistor M10 has the function that the repeater select transistor M10 is turned on through the repeater select signal so that all the first transistors M1 in corresponding repeaters 35 operate to output the second control signal to the discharge circuits 32; alternatively, the repeater select transistor M10 is turned off through the repeater select signal so that all the first transistors M1 in the corresponding repeaters 35 do not output the second control signal to the discharge circuits 32. Since the repeater 35 corresponds to the corresponding memory array block 21, the memory array block 21 may be selected by controlling the repeater 35.

Figure 13:
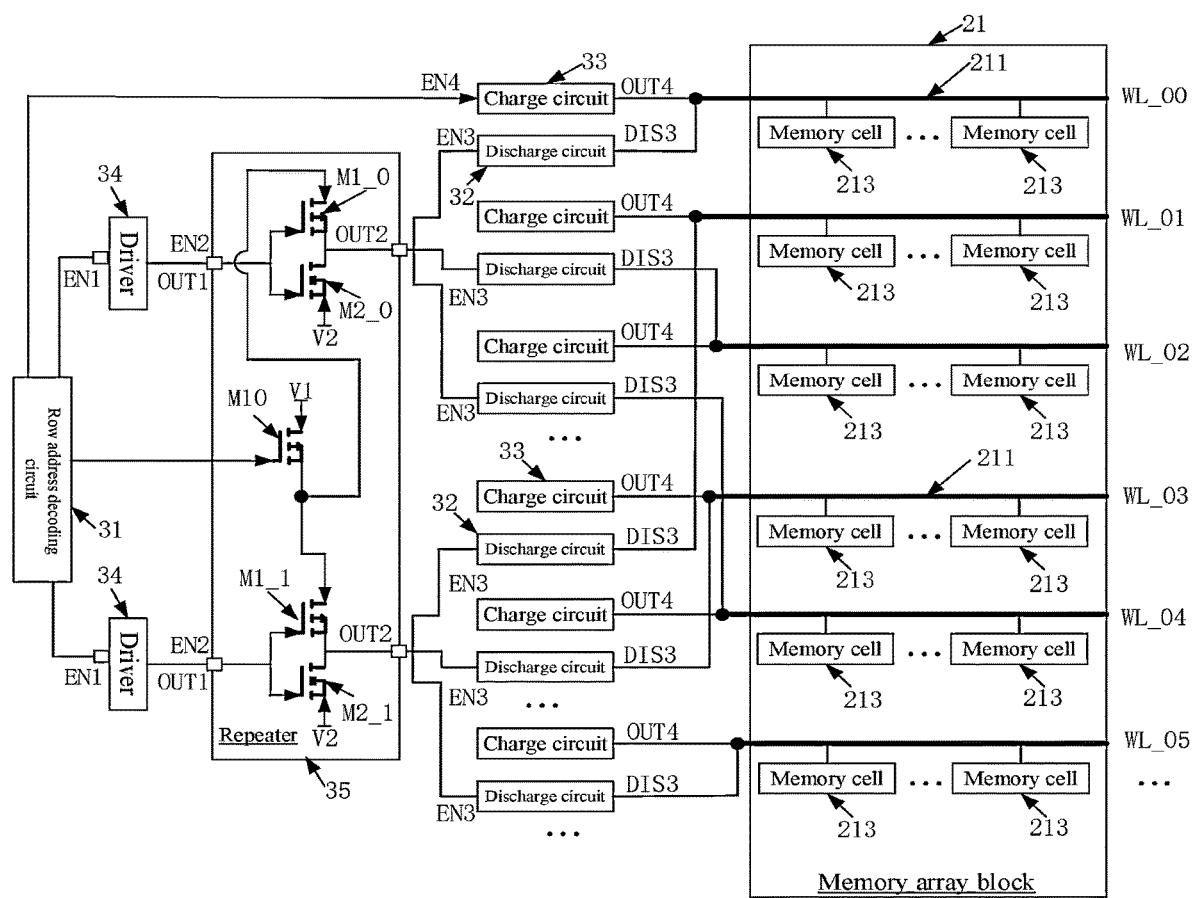
FIG. 13 is a block diagram of another peripheral circuit according to some embodiments.

Exemplarily, as shown in FIG. 13, word lines 211 in one memory array block 21 are divided into word lines 211 with odd row addresses and word lines 211 with an even row addresses, and for one memory array block 21, a repeater 35 is correspondingly provided. One repeater 35 comprises a first transistor M1_1 with the odd row address and a second transistor M2_1 with the odd row address, and a first transistor M1_0 with the even row address and a second transistor M2_0 with the even row address, where the first transistor M1_1 with the odd row address and the second transistor M2_1 with the odd row address are used to couple the word lines 211 with odd row addresses in the memory array block 21, and the first transistor M1_0 with the even row address and the second transistor M2_0 with the even row address are used to couple the word lines 211 with even row addresses in the memory array block 21.

Exemplarily, as shown in FIG. 13, a repeater select transistor M10 is provided in the repeater 35. At this time, whether the first transistor M1_1 with an odd row address and the first transistor M1_0 with an even row address in one repeater 35 corresponding to one memory array block 21 operate or not can be controlled simultaneously by the repeater select transistor M10. In the case where the repeater select transistor M10 is turned on, whether the repeater 35 can output the second control signal also depends on whether the driver 34 outputs the first control signal to a corresponding repeater 35. Whether the driver 34 outputs the first control signal is independently controlled by address select information output by the row address decoding circuit 31. Therefore, for one memory array block 21, the first transistor M1_1 with the odd row address and the first transistor M1_0 with the even row address can be controlled by the same repeater select transistor M10. In this implementation scenario, power consumption overhead, cost overhead, and chip area overhead can be reduced without affecting the operating efficiency of the peripheral circuit.

In the embodiments of the present disclosure, the function of the repeater select transistor M10 is essentially to select a word line 211 corresponding to a discharge circuit 32 by turn-on and turn-off.

Exemplarily, when the peripheral circuit 3 and the memory array 2 are processed on the same wafer, the peripheral circuit 3 and the memory array 2 are processed by the same process. The memory cells 213 in the memory array 2 have requirements for the fabrication process. If the fabrication process is too small, the electric charges in the memory cells 213 will be easily lost. Therefore, the memory array 2 and the peripheral circuit 3 are processed simultaneously, and the chip area of the memory 1 is larger due to the fabrication process. Moreover, on the chip, the memory cells 213 in the memory array 2 and the electronic devices in the peripheral circuit 3 are processed alternately and adjacently, which may lead to the fact that the memory cells 213 are not close enough in the memory array 2, and may further lead to a larger chip area. When the memory array 2 is a three-dimensional memory array, the peripheral circuit 3 and the memory array 2 may be processed separately. At this time, the memory cells 213 in the memory array 2 may be manufactured more closely, so that more memory cells 213 can be manufactured in a smaller area, thereby improving the memory performance. Meanwhile, the peripheral circuit 3 can be processed by a smaller fabrication process, the structure of the peripheral circuit 3 can be made more compact, and the chip area occupied by the peripheral circuit 3 can be greatly reduced by means of the smaller fabrication process.

Figure 14:
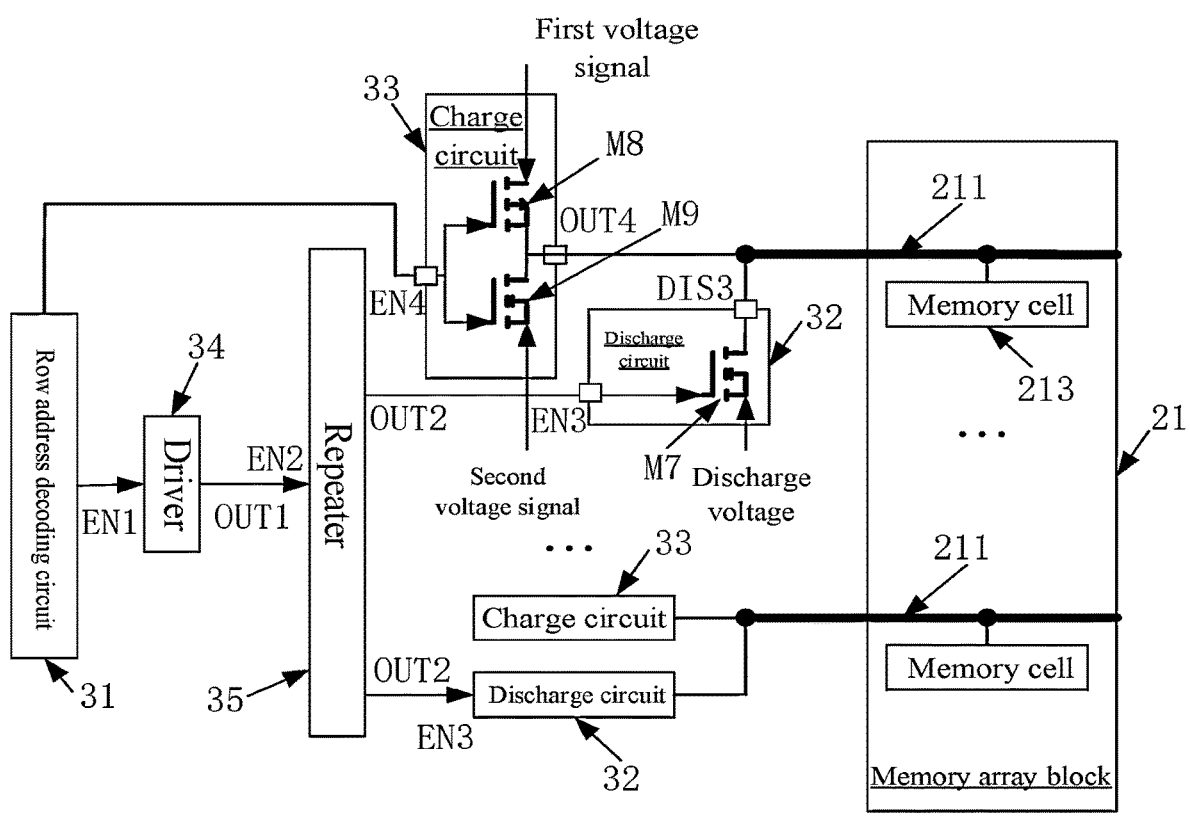
FIG. 14 is a block diagram of another peripheral circuit according to some embodiments.

In some possible implementations, as shown in FIG. 14, the charge circuit 33 comprises an eighth transistor M8 and a ninth transistor M9. A first electrode of the eighth transistor M8 is used to input a first voltage signal; a first electrode of the ninth transistor M9 is used to input a second voltage signal; a gate of the eighth transistor M8 and a gate of the ninth transistor M9 are coupled and then used together as a controlled terminal EN4 of the charge circuit 33; a second electrode of the eighth transistor M8 and a second electrode of the ninth transistor M9 are coupled and then used together as an output terminal OUT4 of the charge circuit 33, and the output terminal OUT4 of the charge circuit 33 is coupled with a corresponding word line 211. A voltage value of the first voltage signal is greater than that of the second voltage signal.

Exemplarily, taking the eighth transistor M8 as a PMOS transistor, the ninth transistor M9 as an NMOS transistor, the first voltage signal at the high level and the second voltage signal at the low level as an example, the row address decoding circuit 31 inputs a charge control signal (low level) to the controlled terminal EN4 of the charge circuit 33, and then controls the second electrode of the eighth transistor M8 to output the first voltage signal (high level) to the corresponding word line 211 through the charge control signal (low level). The first voltage signal is taken as a charge voltage to charge the word line 211. The row address decoding circuit 31 inputs the charge control signal (high level) to the controlled terminal EN4 of the charge circuit 33, and then controls the second electrode of the ninth transistor M9 to output the second voltage signal (low level) to the corresponding word line 211 through the charge control signal (high level) so as not to charge the word line 211.

In the embodiments of the present disclosure, a first voltage signal with a certain positive voltage value is output to the corresponding word line 211 through the turned-on eighth transistor M8, so that the voltage of the word line 211 can be increased to complete the charging operation performed on the word line 211.

In some possible implementations, as shown in FIG. 14, one discharge circuit 32 comprises a seventh transistor M7. A first electrode of the seventh transistor M7 is used as a discharge terminal DIS3, the discharge terminal DIS3 is coupled the word line 211; a second electrode of the seventh transistor M7 is a discharge voltage terminal; the discharge voltage terminal is used to connect a discharge voltage (which may be a ground voltage or a negative voltage); and a gate of the seventh transistor M7 is used to input a second control signal. The second control signal is used to control whether the seventh transistor M7 is turned on or not, so as to control whether the word line 211, the discharge terminal DIS3, and the discharge voltage terminal are connected or on. When the seventh transistor M7 is turned on, the voltage of the word line 211 is reduced to discharge the word line 211.

Exemplarily, taking the seventh transistor M7 as an NMOS transistor as an example, the seventh transistor M7 is controlled to be turned on when the second control signal is at the high level, so that the corresponding word line 211 is connected with the discharge voltage terminal with the low voltage, to lower the voltage of the corresponding word line 211.

Exemplarily, when the seventh transistor M7 is a PMOS transistor, the seventh transistor M7 is controlled to be turned on when the second control signal is at the low level, so that the corresponding word line 211 is connected with the discharge voltage terminal with the low voltage, to lower the voltage of the corresponding word line 211.

In the embodiments of the present disclosure, the seventh transistor M7 functions as a switching transistor. When the switching transistor is turned on, the corresponding word line 211 is connected with the discharge voltage terminal, so that the voltage of the corresponding word line 211 is lowered by the discharge voltage connected to the discharge voltage terminal. When different types of transistors are selected as seventh transistor M7, accordingly, the level of the second control signal used to turn on the seventh transistor M7 is also different, and a drive control signal, a first control signal, etc., at corresponding levels may be adaptively set in the aspect of the driver 34.

Exemplarily, when the seventh transistor M7 is used as the discharge circuit 32, the MOS transistor has a hot carrier effect. Hot carrier effect mainly refers to: under the effect of high gate voltage and high leakage voltage, carriers in the MOS transistor continuously accelerate and accumulate energy when moving from the source to the drain of the MOS transistor, such that ordinary carriers become hot carriers finally. Hot carriers refer to carriers after energy accumulation. These hot carriers collide and ionize in the process of movement, and transfer energy to the lattice. When some carriers accumulate enough kinetic energy, they can overcome a barrier of a Si—SiO2 interface and enter into the gate dielectric of the MOS transistor. In the process that carriers constantly cross the barrier of the Si—SiO2 interface and are injected into the gate dielectric, some hot carriers will produce interface states with damaging effects at the Si—SiO2 interface, while others will enter into the gate oxide layer and form oxide layer trap charges. Electrons and holes may be generated by collision ionization in the semiconductor. Because the drain voltage is the high voltage and the electrons are negatively charged, the effect of such high electric field may drive some of the generated electrons to continuously flow to the drain of the MOS transistor and become a part of the source-drain current. In addition, another part of electrons will mainly cause damage to the gate oxide dielectric, and overcome many difficulties through tunneling under the action of a longitudinal high-strength gate voltage, and finally reach the gate to form the gate current. In addition, the holes obtained by collision ionization are positively charged, and may move to the substrate under the drive of a forward gate voltage to form a substrate current. In practical applications, the substrate current can be used as an important parameter to detect the risk of hot carrier injection.

In practical applications, an NMOS transistor is often used as a seventh transistor M7. For the NMOS transistor, the substrate current related to the interface state can roughly reflect the hot carrier effect of the transistor. In the NMOS transistor, the decline degree of the drain current of the NMOS transistors is proportional to the substrate current. Previous studies have shown that when the gate voltage is about half of the drain voltage, the hot carrier injection effect reaches the maximum condition. Nowadays, however, as the size of the transistor becomes smaller and smaller, and the input voltage does not change, more and more studies have shown that when the gate voltage is equal to the drain voltage in the case of a transistor with a smaller size, the hot carrier injection effect reaches the maximum condition. The hot carrier injection effect is generated in a long-term accumulation process. As the time of generating the hot carrier injection effect is accumulated to a certain time, the MOS transistor is damaged to a certain extent, which leads to the failure of the MOS transistor.

Taking the seventh transistor M7 as an NMOS transistor as an example: as shown in FIG. 14, specifically, the first electrode of the seventh transistor M7 is a drain, and the second electrode of the seventh transistor M7 is a source. When being turned on due to the fact that the gate is subjected to the high level, the seventh transistor M7 is connected with the discharge voltage at the source. At this time, because the drain of the seventh transistor M7 is coupled with the word line 211, and a voltage of the word line 211 is greater than the discharge voltage of the source of the seventh transistor M7, the current across the word line 211 is input into the drain of the seventh transistor M7 as a drain current and output through the source of the seventh transistor M7, thus achieving the purpose of discharging the word line 211. In the discharge process, electric charges on the word line 211 gradually decrease, while the substrate current of the seventh transistor M7 gradually increases. At this stage, there may be a hot carrier injection effect. The current related to the substrate of the MOS transistor drives the carriers to drift longitudinally, and absorb sufficiently high energy under the action of the high field in the surface barrier region to cross over the barrier after the kinetic energy reaches a certain level, thereby causing damage and degrading the device performance. Then, the seventh transistor M7 may reach the accumulated maximum duration of the hot carrier injection effect more quickly, so that the performance of the seventh transistor M7 degrades to the extent that it cannot operate normally, meaning that the seventh transistor M7 is scrapped. Therefore, the longer the discharge time of discharge by the seventh transistor M7, the longer the duration of the hot carrier injection effect, and the shorter the service life of the seventh transistor M7.

Figure 19:
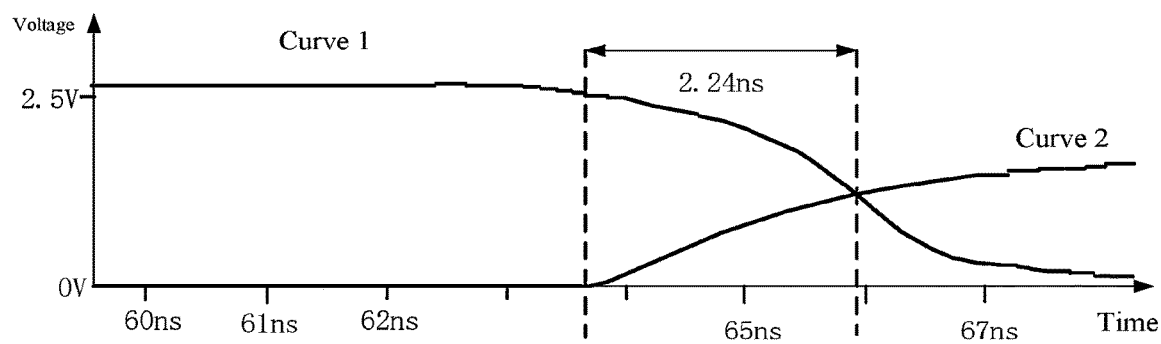
FIG. 19 is a schematic diagram of a hot carrier injection effect duration of a seventh transistor according to some embodiments.
Figure 20:
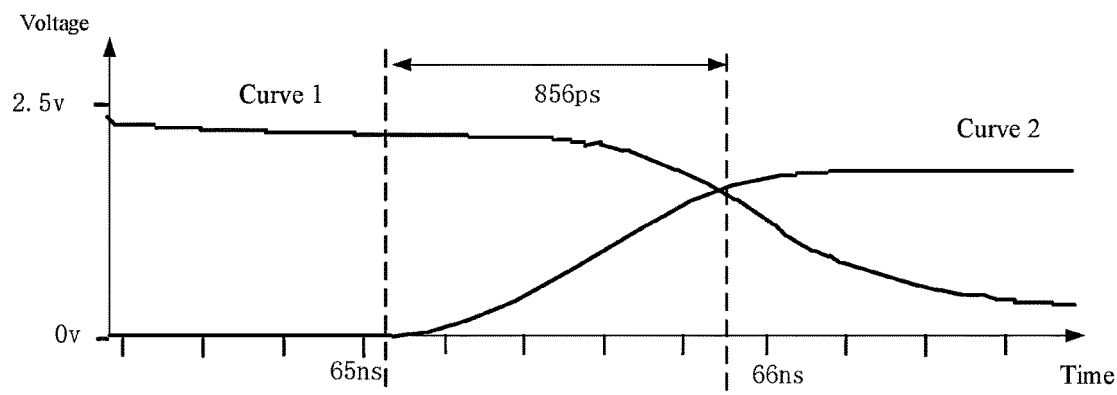
FIG. 20 is a schematic diagram of a hot carrier injection effect duration of another seventh transistor according to some embodiments.

After a test, when the first control signal is generated by the driver 34 and output to the seventh transistor M7 of the discharge circuit 32, and the seventh transistor M7 is controlled to be turned on through the first control signal, a single discharge duration is 8.11 ns. When the first control signal is generated by the driver 34 and output to the repeater 35, and the second control signal is generated by the repeater 35 to control the seventh transistor M7 to be turned on, a single discharge duration is 7.03 ns. It can be seen that after using the repeater 35, the single discharge speed is increased by 1.08 ns (the speed is increased by about 13.3%). As shown in FIG. 19, the figure illustrates the change sequence diagram of the gate voltage and the drain voltage of the seventh transistor M7 when the first control signal is generated by the driver 34 and output to the seventh transistor M7 of the discharge circuit 32, and the seventh transistor M7 is controlled to be turned on through the first control signal. In the figure, curve 1 is a change curve of the drain voltage, and curve 2 is the change curve of the gate voltage. It can be seen that when the seventh transistor M7 is controlled to be turned on through the first control signal, the duration of the hot carrier injection effect is 2.24 ns in a single discharge process. As shown in FIG. 20, the figure illustrates the change sequence diagram of the gate voltage and the drain voltage of the seventh transistor M7 when the first control signal is generated by a driver 34 and output to the repeater 35, and the second control signal is generated by the repeater 35 to control the seventh transistor M7 to be turned on. In the figure, curve 1 is the change curve of the drain voltage, and curve 2 is the change curve of the gate voltage. It can be seen that by adding the repeater 35, the second control signal with a larger drive capability is generated by the repeater 35 according to the first control signal, to reduce the discharge duration, thereby making the duration of the hot carrier injection effect in a single discharge process be 856 pn. In contrast, by providing the repeater 35, the duration of the hot carrier injection effect is reduced by 1.384 ns (about 61.8%) in the single discharge process, which greatly prolongs the service life of the seventh transistor M7, thereby increasing the service life of the memory 1.

In some possible implementations, the memory cell 213 may be the memory cell including a field effect transistor and a capacitor, the memory cell including a semi-floating gate transistor or the memory cell including a floating gate transistor, or the like.

Figure 15:
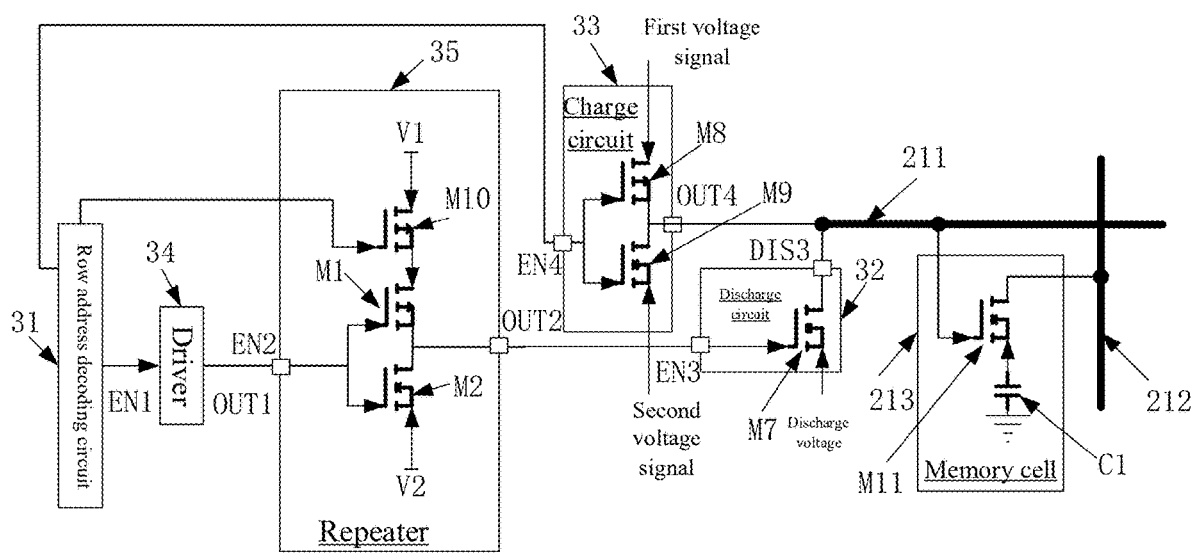
FIG. 15 is a block diagram of another peripheral circuit according to some embodiments.

Exemplarily, taking the memory 1 as a dynamic random access memory (DRAM) as an example, at this time, as shown in FIG. 15, one memory cell 213 comprises a memory transistor M11 and a memory capacitor C1, where a gate of the memory transistor M11 is coupled to a corresponding word line 211, and is coupled to a discharge terminal DIS3 of a corresponding discharge circuit 32 and an output terminal OUT4 of a corresponding charge circuit 33 through the corresponding word line 211. A source of the memory transistor M11 is coupled with the memory capacitor C1. A drain of the memory transistor M11 is coupled to a bit line 212 of a corresponding column.

Figure 16:
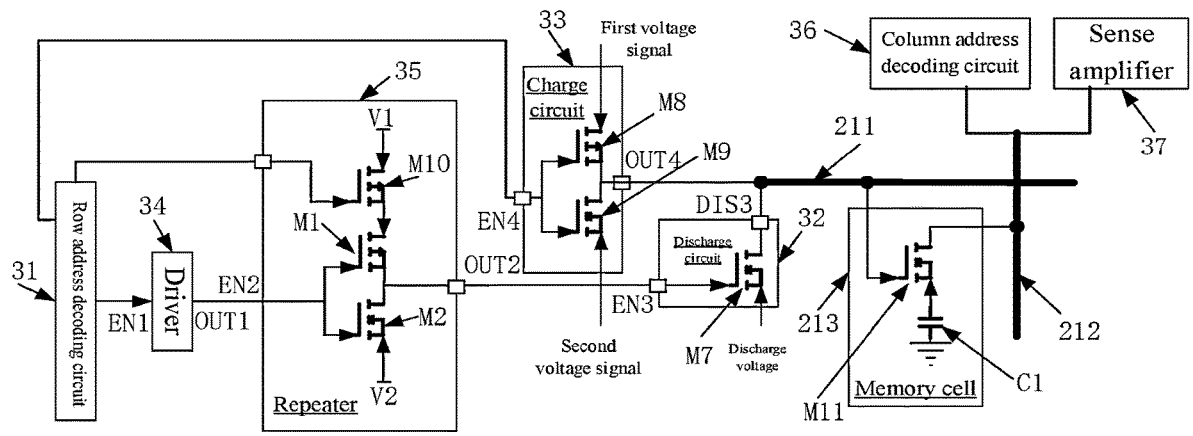
FIG. 16 is a block diagram of another peripheral circuit according to some embodiments.

In some possible implementations, as shown in FIG. 16, the peripheral circuit 3 further comprises a column address decoding circuit 36 and a plurality of sense amplifiers (SA) 37, and input terminals of the column address decoding circuit 36 and each sense amplifier 37 are coupled with a corresponding bit line 212.

In the embodiments of the present disclosure, the column address decoding circuit 36 is used to select a corresponding bit line 212 to perform a programming operation on all or some of the memory cells 213 coupled to the selected bit line 212 and also coupled to the selected word line 211. The sense amplifier 37 compares the voltage value output by the memory cell 213 corresponding to the selected word line 211 on the coupled bit line 212, and determines whether the data stored in the memory cell 213 is data 0 or data 1 according to the magnitude between the voltage value and a comparison value.

In some possible implementations, according to actual product requirements, the layout of the peripheral circuit 3 on the chip may be adaptively adjusted and designed in the semiconductor chip manufacturing of the memory 1.

Figure 17:
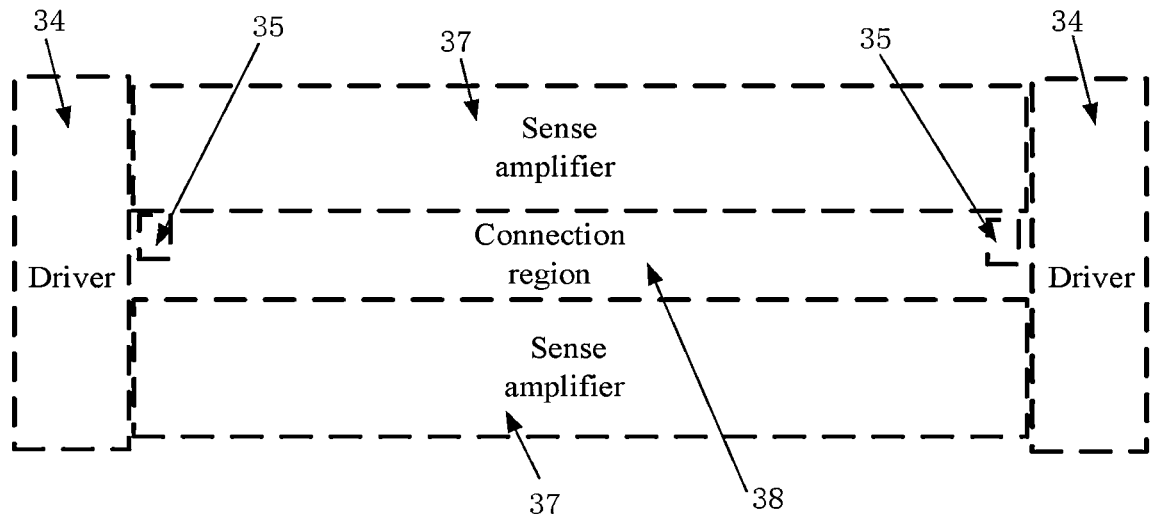
FIG. 17 is a chip layout diagram of a peripheral circuit according to some embodiments.

Exemplarily, the area position distribution of some devices on the peripheral circuit 3 can be as shown in FIG. 17. It should be noted that FIG. 17 is only a specific implementation layout diagram. Adaptive adjustment may be made according to the actual requirements of the chip layout. Various devices of the peripheral circuit 3 are coupled with the word lines 211 and the bit lines 212 in the memory array 2 through a connection region 38.

Figure 18:
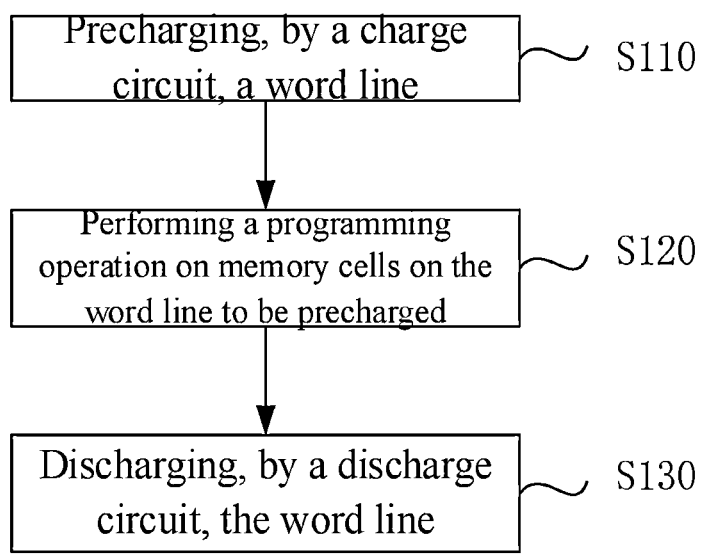
FIG. 18 is a flow diagram of a drive method according to some embodiments.

The above memory including the structures shown in FIGS. 5, 6, 7, 8, 9, 10, 11, 12, 13, 14, 15, and 16 can be used to perform the drive method including the following steps S110-S130 as shown in FIG. 18.

Step S110: precharging, by the charge circuit 33, the word line 211.

In some possible implementations, as shown in FIGS. 6, 7, 8, 13, 14, 15, and 16, the row address decoding circuit 31 receives word line address information which is used to indicate that a programming operation is required to be performed on the word line 211 corresponding to a certain row address. Furthermore, the row address decoding circuit 31 outputs a charge control signal to a corresponding charge circuit 33 according to the word line address information, and the charge circuit 33 receiving the charge control signal outputs a charge voltage to the corresponding word line 211, so as to precharge the word line 211.

Exemplarily, as shown in FIG. 14, the charge circuit 33 comprises an eighth transistor M8 and a ninth transistor M9. For the operating principle and technical effect that the charge circuit 33 as shown in FIG. 14 precharges the word line 211, refer to the related description in the embodiment of the memory 1 above-described, which will not be repeated here.

Exemplarily, each word line 211 in the memory array block 21 corresponds to a row address, and each bit line in the memory array block 21 corresponds to a column address. By combining the row address and the column address, a memory address corresponding to each memory cell 213 may be obtained. In practical applications, the corresponding word line 211 can be determined by selecting the row address. Then, by selecting the column address and applying a corresponding voltage to the corresponding bit line 212, a read operation, a write operation, or a refresh operation may be performed on the selected memory cell 213. The read operation, the write operation or the refresh operation may be collectively referred to as the programming operation. In each programming operation, one or more word lines 211 are selected, but not all memory cells 213 on the selected word lines 211 are required to be subjected to the programming operation. In order to avoid the programming disturbance caused by the applied programming voltage to unselected memory cells 213 on the certain word line 211 when the programming operation is performed on the selected memory cells 213 on the word line 211 during the programming process, the word line 211 selected in a next programming cycle is precharged, and the word line 211 selected in a current programming cycle is discharged before the start of the current programming cycle (that is, before the end of a previous programming cycle). After the word line 211 selected in the current programming cycle is discharged and the word line 211 selected in the next programming cycle is precharged, the next programming cycle can be started to perform the programming operation on the selected memory cells 213 on the word line 211 selected in the next programming cycle. Therefore, if the word line 211 in the current programming cycle is discharged for too long time, the cycle duration of one programming cycle may be increased, thereby reducing the programming efficiency.

In the embodiments of the present disclosure, the first voltage signal (e.g., at the high level) is output to the corresponding word line 211 through the turned-on eighth transistor M8, so that the voltage of the word line 211 may be increased to complete the charge operation performed on the word line 211.

Step S120: performing the programming operation on memory cells 213 on the word line 211 to be precharged.

In some possible implementations, as shown in FIG. 16, the peripheral circuit 3 further comprises a column address decoding circuit 36 and a plurality of sense amplifiers (SA) 37.

Exemplarily, taking the memory 1 as a dynamic random access memory (DRAM) as an example, at this time, the structure of one memory cell 213 in the memory 1 may be as shown in FIG. 15. The operating principle of the memory cell 213 is as follow: data 0 or data 1 is represented by the amount of electric charges stored in the memory capacitor C1. The principle of performing the read operation on the memory cell 213 is as follows: the memory transistor M11 is turned on, and a voltage value corresponding to the amount of electric charges in the memory capacitor C1 is detected through a corresponding bit line 212. When the voltage value is greater than a certain value, it means that data 1 is stored. Otherwise, it means that data 0 is stored. The principle of performing the write operation on the memory cell 213 is as follows: the memory transistor M11 is turned on, and then electric charges are input into the memory capacitor C1 to complete the operation of writing data 1. Alternatively, the memory transistor M11 is turned on, and then the electric charges in the memory capacitor C1 are released to complete the operation of writing data 0. The refresh operation is as follows: the read operation is performed on the data stored in the memory cell 213 first, and then the write operation is re-performed on the data, so as to avoid the influence of the loss of the electric charges stored in the memory capacitor C1 on the read operation, etc. due to a long storage time. According to the above description, it can be seen that the corresponding memory transistor M11 needs to be turned on in each of the read operation, the write operation, and the refresh operation. The specific turn-on mode is as follows: the voltage value of the corresponding word line 211 is adjusted to control whether the memory transistor M11 on the word line 211 is turned on. In the embodiments of the present disclosure, the column address decoding circuit 36 is used to select the corresponding bit line 212 to perform the programming operation on all or some of the memory cells 213 coupled to the selected bit line 212 and also coupled to the selected word line 211. The sense amplifier 37 compares the voltage value output by the memory cell 213 corresponding to the selected word line on the coupled bit line 212, and determines whether the data stored in the memory cell 213 is data 0 or data 1 according to the magnitude between the voltage value and a comparison value.

Exemplarily, according to different actual programming operations, in the programming operation phase, processing such as corresponding precharging, etc. may also be performed on the bit line 212.

S130: discharging, by the discharge circuit 32, the word line 211.

In some possible implementations, the row address decoding circuit 31 receives word line address information, and controls the corresponding discharge circuit 32 to perform the discharge operation on the word line 211 on which the programming operation is performed according to the row address indicated by the word line address information.

In some possible implementations, the row address decoding circuit 31 may control the discharge circuit 32 to discharge all the word lines 211 on which the programming operation is not performed and the word lines 211 on which the precharging operation is not performed.

In some possible implementations, the row address decoding circuit 31 may also control the discharge circuit 32 corresponding to the word line 211 on which the programming operation is performed to discharge the word line 211 after the programming operation is completed.

In some possible implementations, as shown in FIGS. 8, 9, and 10, the row address decoding circuit 31 controls the driver 34 to output the first control signal to the repeater 35 by outputting a drive control signal to the driver 34, and the repeater 35 outputs the second control signal to the discharge circuit 32 to control the discharge circuit 32 to discharge the corresponding word line 211.

In the embodiments of the present disclosure, for the technical effect and operating principle that the row address decoding circuit 31 controls the discharge circuit 32 to discharge the corresponding word line 211 through the drive control signal, refer to the related description in the embodiment of the memory 1, which will not be repeated here.

In some possible implementations, as shown in FIGS. 11, 12, and 13, the repeater 35 comprises the first transistor M1 and the first voltage terminal V1. A gate of the first transistor M1 is coupled with the controlled terminal EN2 of the repeater 35, to input the first control signal; a first electrode of the first transistor M1 is coupled with the first voltage terminal V1; the first voltage terminal V1 is used to input the second control signal; and a second electrode of the first transistor M1 is coupled with the controlled terminal EN3 of a discharge circuit 32. The repeater 35 outputs the second control signal to the controlled terminal EN3 of the discharge circuit 32 under the control of the input first control signal.

Exemplarily, as shown in FIG. 12, the repeater 35 further comprises the repeater select transistor M10. A first electrode of the repeater select transistor M10 is used to input the second control signal. The first electrode of the first transistor M1 is coupled with the second electrode of the repeater select transistor M10. The second control signal input to the first electrode of the repeater select transistor M10 is output from the second electrode of the repeater select transistor M10 to the first electrode of the first transistor M1 after controlling the first electrode and the second electrode of the repeater select transistor M1 to be turned on through the repeater select signal. For the technical effect of the repeater select transistor M10, refer to the related description of the memory 1 above-described, which will not be repeated here.

In the embodiment of the present disclosure, the first transistor M1 can be controlled through the first control signal, and then whether to output the second control signal to control the discharge circuit 32 to discharge the word line 211 through the discharge terminal DIS3 is implemented. For the technical effect and operating principle that the repeater 35 generates the second control signal according to the first control signal, refer to the related description of the memory 1 above described, which will not be repeated here.

Exemplarily, as shown in FIGS. 14, 15, and 16, the discharge circuit 32 comprises the seventh transistor M7. A first electrode of the seventh transistor M7 is coupled with the word line 211. A voltage of the word line 211 is discharged through the first electrode and second electrode of the seventh transistor M7, which are turned on after controlling the first electrode and second electrode of the seventh transistor M7 to be turned on according to the second control signal. For the technical effect of the seventh transistor M7, refer to the related description of the memory 1 above described, which will not be repeated here.

The embodiment of the present disclosure provides a memory and a drive method. The memory may comprise the above-described structures as shown in FIGS. 5, 6, 7, 8, 9, 10, 11, 12, 13, 14, 15, 16, and 17. By disposing a repeater in the peripheral circuit of the memory, the length of the routing metal line through which the second control signal used to drive the discharge circuit is transmitted is reduced, thus reducing the drive response time for driving the discharge circuit and the discharge duration. Meanwhile, when the discharge circuit is of a structure of the seventh transistor M7, the longer the discharge duration is, the longer the seventh transistor M7 is in the hot carrier injection effect state, which will reduce the service life of the discharge circuit, and thus greatly reducing the service life of the memory. By reducing the discharge duration of the discharge circuit, the service life of the memory may be relatively prolonged.

Figure 21:
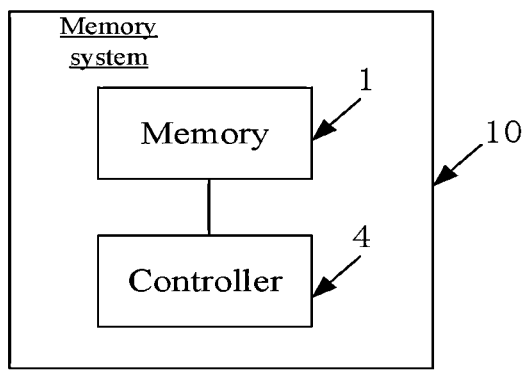
FIG. 21 is a block diagram of a memory system according to some embodiments.
Figure 22:
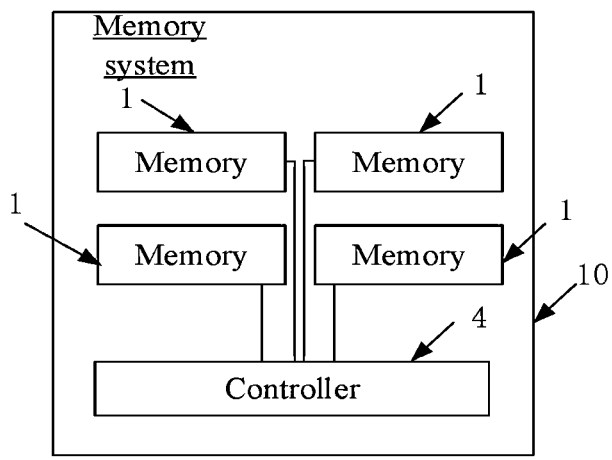
FIG. 22 is a block diagram of another memory system according to some embodiments.

The embodiment of the present disclosure further provides a memory system, as shown in FIGS. 21 and 22, where FIG. 21 is the block diagram of the memory system according to some embodiments. FIG. 22 is the block diagram of the memory system according to other embodiments.

Referring to FIGS. 21 and 22, some embodiments of the present disclosure further provide a memory system 10. The memory system 10 comprises a controller 4 and the memory 1 in some embodiments as described above. The controller 4 is coupled to the memory 1 to control the memory 1 to store data.

The memory system 10 may be integrated into various types of storage devices, for example, being included in the same package (e.g., a Universal Flash Storage (UFS) package or an Embedded Multi Media Card (eMMC) package. That is, the memory system 10 may be applied to and packaged into different types of electronic products, such as a mobile phone (e.g., cell phone), a desktop computer, a tablet computer, a laptop computer, a server, a vehicle-mounted device, a gaming console, a printer, a positioning device, a wearable device, a smart sensor, a mobile power supply, a virtual reality (VR) device, an augmented reality (AR) device, or any other suitable electronic devices with a memory therein.

In some embodiments, refer to FIG. 21, the memory system 10 comprises the controller 4 and one memory 1, and the memory system 10 may be integrated into a memory card.

The memory card may comprise at least one of a PC card (PCMCIA, Personal Computer Memory Card International Association), a Compact Flash (CF) card, a Smart Media (SM) card, a memory stick, a Multimedia Card (MMC), a Secure Digital Memory Card (SD card) and a UFS.

In other embodiments, referring to FIG. 22, the memory system 10 comprises the controller 4 and a plurality of memories 1, and the memory system 10 is integrated into a Solid-State Drive (SSD).

In the memory system 10, in some embodiments, the controller 4 is configured to operate in a low duty cycle environment, such as SD card, CF card, universal serial bus (USB) flash drives, or other media for use in electronic devices such as personal computer, digital camera, mobile phone, etc.

In other embodiments, the controller 4 is configured to operate in a high duty cycle environment, such as the SSD or eMMC which is used as data storage for mobile devices, such as smartphones, tablets, laptop computers, etc., and enterprise storage arrays.

In some embodiments, the controller 4 may be further configured to manage the data stored in the memory 1 and communicate with external devices (e.g., the host). In some embodiments, the controller 4 may be further configured to control operations of the memory 1, such as reading, erasing, programming, etc. In some embodiments, the controller 4 may be further configured to manage various functions with respect to data stored or to be stored in the memory 1, including at least one of bad block management, garbage collection, logical to physical address translation, and wear leveling. In some embodiments, the controller 4 may be further configured to process error correction codes with respect to data read from or written to the memory 1.

Of course, the controller 4 may further perform any other suitable functions, such as formatting the memory 1. For example, the controller 4 may communicate with external devices (e.g., the host) through at least one of various interface protocols.

It should be noted that the interface protocols comprise at least one of a USB protocol, a MMC protocol, a Peripheral Component Interconnect (PCI) protocol, a PCI-Express (PCI-E) protocol, an Advanced Technology Attachment (ATA) protocol, a Serial ATA protocol, a Parallel ATA protocol, a Small Computer Small Interface (SCSI) protocol, an Enhanced Small Disk Interface (ESDI) protocol, an Integrated Drive Electronics (IDE) protocol, and a Firewire protocol.

Some embodiments of the present disclosure further provide an electronic device. The electronic device may be any one of a mobile phone, a desktop computer, a tablet, a laptop computer, a server, a vehicle-mounted device, a wearable device (such as a smart watch, a smart bracelet, a pair of smart glasses, or the like), a mobile power supply, a gaming console, a digital multimedia player, etc.

Figure 23:
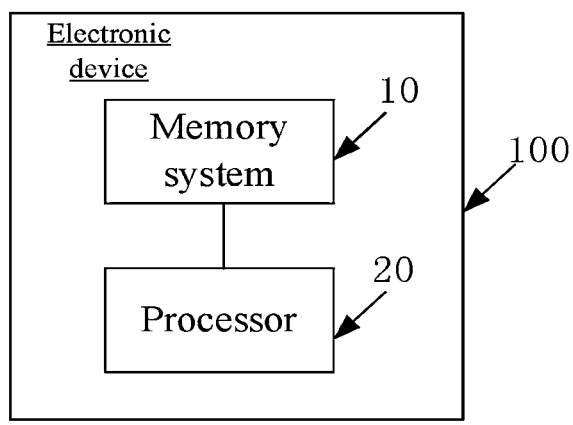
FIG. 23 is a block diagram of an electronic device according to some embodiments.

As shown in FIG. 23, the electronic device 100 may comprise the memory system 10 described above, and may further comprise at least one of a processor 20, a cache, etc.

Exemplarily, the processor 20 may be a chip, specifically, a field programmable gate array (FPGA), an application specific integrated circuit (ASIC), a system on chip (SoC), a central processor unit (CPU), a network processor (NP), a digital signal processor (DSP), a micro controller unit (MCU), or a programmable logic device (PLD) or other integrated chips.

The foregoing descriptions are only specific implementations of the present disclosure, but the scope of protection of the present disclosure is not limited thereto. Variations or replacements within the technical scope of the present disclosure may be readily conceived by those skilled in the art, which shall fall within the scope of protection of the present disclosure. Therefore, the scope of protection of the present disclosure should be defined only by the scope of protection of the claims.

What is claimed is:

1. A memory, comprising:
   a driver;
   a repeater;
   a discharge circuit; and
   a memory array,
   wherein:
   the discharge circuit is arranged in a peripheral circuit that comprises the driver and is bonded with the memory array;
   an output terminal of the driver is coupled with a controlled terminal of the repeater;
   an output terminal of the repeater is coupled with a controlled terminal of the discharge circuit;
   the discharge circuit is coupled with a word line in the memory array;
   the driver is configured to output a first control signal to the repeater; and
   in response to receiving a repeater select signal directly from a row address decoding circuit, the repeater outputs a second control signal to the discharge circuit according to the first control signal, and in response to the second control signal, the discharge circuit performs a discharge operation.

2. The memory of claim 1, wherein
   the repeater comprises a first transistor and a first voltage terminal;
   a gate of the first transistor is coupled with the controlled terminal of the repeater;
   a first electrode of the first transistor is coupled with the first voltage terminal;
   the first voltage terminal is configured to input the second control signal; and
   a second electrode of the first transistor is coupled with the output terminal of the repeater.

3. The memory of claim 2, wherein
   the repeater further comprises a repeater select transistor;
   a first electrode of the repeater select transistor is coupled with the first voltage terminal;
   a second electrode of the repeater select transistor is coupled with the first electrode of the first transistor; and
   the first electrode of the first transistor is coupled with the first voltage terminal through the repeater select transistor, a gate of the repeater select transistor being directly connected with the row address decoding circuit and configured to receive the repeater select signal.

4. The memory of claim 2, wherein
   the repeater further comprises a second transistor and a second voltage terminal;
   a gate of the second transistor is coupled with the controlled terminal of the repeater;
   a first electrode of the second transistor is coupled with the second voltage terminal;
   the second voltage terminal is configured to input a third control signal; and
   a second electrode of the second transistor is coupled with the output terminal of the repeater.

5. The memory of claim 1, wherein
   the driver comprises a controlled terminal and cascaded inverters;
   the controlled terminal of the driver is configured to input a drive control signal;
   a controlled terminal of a first-stage inverter of the cascaded inverters is coupled with the controlled terminal of the driver; and
   an output terminal of a last-stage inverter of the cascaded inverters is coupled with the output terminal of the driver.

6. The memory of claim 5, wherein
   the driver further comprises a third voltage terminal and a fourth voltage terminal;
   the third voltage terminal is configured to input a first voltage signal;
   the fourth voltage terminal is configured to input a second voltage signal;
   each of the cascaded inverters comprises a first inverter circuit;
   the first inverter circuit comprises a third transistor and a fourth transistor;
   a first electrode of the third transistor is coupled with the third voltage terminal
   a first electrode of the fourth transistor is coupled with the fourth voltage terminal;
   a gate of the third transistor and a gate of the fourth transistor are coupled and configured together as a controlled terminal of the first inverter circuit; and
   a second electrode of the third transistor and a second electrode of the fourth transistor are coupled and configured together as an output terminal of the first inverter circuit.

7. The memory of claim 6, wherein
   one or more of the cascaded inverters further comprises a second inverter circuit;
   the second inverter circuit comprises a fifth transistor and a sixth transistor;
   a first electrode of the fifth transistor is coupled with the third voltage terminal;
   a first electrode of the sixth transistor is coupled with the fourth voltage terminal;
   a gate of the fifth transistor and a gate of the sixth transistor are coupled and configured together as a controlled terminal of the second inverter circuit;
   a second electrode of the fifth transistor and a second electrode of the sixth transistor are coupled and configured together as an output terminal of the second inverter circuit;
   the output terminal of the second inverter circuit is coupled with the controlled terminal of the first inverter circuit in a corresponding stage inverter of the cascaded inverters; and
   the controlled terminal of the second inverter circuit is coupled with the output terminal of the first inverter circuit in the corresponding stage inverter of the cascaded inverters.

8. The memory of claim 5, wherein
the memory comprises the row address decoding circuit coupled with a gating terminal of the driver;
the row address decoding circuit is configured to output an address select signal to the gating terminal of the driver; and
the address select signal is configured to control the driver to stop outputting the first control signal to the repeater.

9. The memory of claim 8, wherein
the driver further comprises an address select switching transistor;
a gate of the address select switching transistor is coupled with the row address decoding circuit through the gating terminal of the driver;
a first electrode of the address select switching transistor is coupled to one of the cascaded inverters; and
the address select signal is configured to control the address select switching transistor to be turned on or turned off.

10. The memory of claim 1, wherein
the discharge circuit comprises a seventh transistor;
a first electrode of the seventh transistor is coupled with the word line;
a second electrode of the seventh transistor is a discharge voltage terminal;
the discharge voltage terminal is configured to connect a discharge voltage; and
a gate of the seventh transistor is configured to input the second control signal.

11. The memory of claim 10, wherein
the driver further comprises a charge circuit;
an output terminal of the charge circuit is coupled with the word line;
the charge circuit is configured to input a charge control signal; and
the charge control signal is configured to control the charge circuit to output a charge voltage to the word line.

12. A method for driving a memory comprising a driver, a repeater, a discharge circuit arranged in a peripheral circuit that comprises the driver and is bonded with a memory array, and the memory array, the memory array comprising memory array blocks, the discharge circuit being coupled with a word line in the memory array blocks, the method comprising:
controlling the driver to output a first control signal to the repeater; and
in response to receiving a repeater select signal directly from a row address decoding circuit, controlling the repeater to output a second control signal to the discharge circuit according to the first control signal, wherein the discharge circuit is configured to perform a discharge operation according to the second control signal.

13. The method of claim 12, wherein
the repeater comprises a first transistor; and
the controlling the repeater to output the second control signal to the discharge circuit according to the first control signal comprises:
outputting the second control signal at a first electrode of the first transistor from a second electrode of the first transistor to the discharge circuit after controlling the first electrode and second electrode of the first transistor to be turned on according to the first control signal.

14. The method of claim 13, wherein
the repeater further comprises a repeater select transistor; and
the method further comprises:
outputting the second control signal at a first electrode of the repeater select transistor from a second electrode of the repeater select transistor to the first electrode of the first transistor after controlling the first electrode and the second electrode of the repeater select transistor to be turned on according to the repeater select signal.

15. The method of claim 12, wherein the controlling the driver to output the first control signal to the repeater comprises:
controlling the driver to output the first control signal to the repeater according to a drive control signal.

16. The method of claim 15, further comprising:
controlling the driver to stop outputting the first control signal to the repeater according to a word line address of the word line.

17. The method of claim 12, wherein
the discharge circuit comprises a seventh transistor;
a first electrode of the seventh transistor is coupled with the word line; and
the method further comprises:
discharging a voltage of the word line through the first electrode and a second electrode of the seventh transistor that are turned on after controlling the first electrode and the second electrode of the seventh transistor to be turned on according to the second control signal.

18. The method of claim 17, wherein
the memory further comprises a charge circuit; and
the method further comprises:
controlling the charge circuit to output a charge voltage to the word line according to a charge control signal.

19. A memory system, comprising:
a memory comprising:
a driver;
a repeater; a discharge circuit; and
a memory array,
wherein:
an output terminal of the driver is coupled with a controlled terminal of the repeater;
an output terminal of the repeater is coupled with a controlled terminal of the discharge circuit;
the discharge circuit is coupled with a word line in the memory array;
the driver is configured to output a first control signal to the repeater; and
the repeater is configured to receive a repeater select signal directly from a row address decoding circuit to select a memory array block of the memory array and output a second control signal to the discharge circuit according to the first control signal; and
a controller coupled to the memory to control the memory to store data.

20. The memory system of claim 19, wherein
the repeater comprises a first transistor and a first voltage terminal;
a gate of the first transistor is coupled with the controlled terminal of the repeater;
a first electrode of the first transistor is coupled with the first voltage terminal;
the first voltage terminal is configured to input the second control signal; and a second electrode of the first transistor is coupled with the output terminal of the repeater.

* * * * *